United States Patent
Barbu et al.

(10) Patent No.: US 11,431,300 B2
(45) Date of Patent: Aug. 30, 2022

(54) MACHINE LEARNING BASED DIGITAL PRE-DISTORTION FOR POWER AMPLIFIERS

(71) Applicant: Nokia Technologies Oy, Espoo (FI)

(72) Inventors: Oana-Elena Barbu, Aalborg (DK); Benny Vejlgaard, Gistrup (DK); Johannes Harrebek, Aalborg (DK)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 17/331,145

(22) Filed: May 26, 2021

(65) Prior Publication Data

US 2021/0391832 A1     Dec. 16, 2021

(30) Foreign Application Priority Data

Jun. 12, 2020   (FI) ...................................... 20205611

(51) Int. Cl.
*H03F 1/32* (2006.01)
*H03F 3/24* (2006.01)
*H04B 1/04* (2006.01)

(52) U.S. Cl.
CPC ............ *H03F 1/3247* (2013.01); *H03F 3/24* (2013.01); *H04B 1/04* (2013.01); *H03F 1/3258* (2013.01); *H03F 2200/451* (2013.01); *H03F 2201/3233* (2013.01); *H04B 2001/0425* (2013.01)

(58) Field of Classification Search
CPC ........ H03F 1/3247; H03F 1/3258; H03F 3/24; H03F 2200/451; H03F 2201/3233; H04B 1/04; H04B 2001/0425
USPC ........................................................ 375/297
See application file for complete search history.

(56) References Cited

U.S. PATENT DOCUMENTS

| | | | |
|---|---|---|---|
| 10,581,469 B1 * | 3/2020 | O'Shea | ..................... G06N 3/08 |
| 2013/0343483 A1 | 12/2013 | Bai | |
| 2018/0167091 A1 | 6/2018 | Pratt et al. | |

(Continued)

FOREIGN PATENT DOCUMENTS

| | | | | |
|---|---|---|---|---|
| EP | 2538553 A1 | 12/2012 | | |
| WO | WO-2016027134 A1 * | 2/2016 | ............. | H03F 3/245 |

(Continued)

OTHER PUBLICATIONS

"Digital Pre-Distortion (DPD) Concept", RFMW, Retrieved on May 18, 2021, Webpage available at: http://rfmw.em.keysight.com/wireless/helpfiles/n7614/Content/Main/Digital%20Pre-Distortion%20(DPD)%20Concept.htm.

(Continued)

*Primary Examiner* — Kevin M Burd
(74) *Attorney, Agent, or Firm* — Harrington & Smith

(57) ABSTRACT

Example embodiments relate to machine learning based digital pre-distortion for power amplifiers. A device may amplify a signal with a power amplifier and transmit the signal. The signal may be received by an internal feedback receiver of the device. The device may further comprise a first machine learning model configured to emulate an external feedback receiver and to generate an emulated feedback signal based on the internal feedback signal. The device may further comprise a second machine learning model configured to determine digital pre-distortion parameters for the power amplifier based on the emulated feedback signal. Apparatuses, methods, and computer programs are disclosed.

20 Claims, 11 Drawing Sheets

(56) References Cited

U.S. PATENT DOCUMENTS

2020/0382147 A1* 12/2020 Menkhoff ............... H03F 3/245

FOREIGN PATENT DOCUMENTS

| WO | 2020/019240 A1 | 1/2020 |
| WO | 2020/055378 A1 | 3/2020 |

OTHER PUBLICATIONS

Tarver et al., "Design and Implementation of a Neural Network Based Predistorter for Enhanced Mobile Broadband", arXiv, Jul. 1, 2019, 6 pages.

Gotthans et al., "Digital Predistortion With Advance/Delay Neural Network and Comparison With Volterra Derived Models", IEEE 25th Annual International Symposium on Personal, Indoor, and Mobile Radio Communication (PIMRC), Sep. 2-5, 2014, pp. 811-815.

Guan, "FPGA-based Nonlinear Convolution", FPGA-based Digital Convolution for Wireless Applications, Part of the Springer Series in Wireless Technology book series (SSWT), 2017, pp. 51-84.

Tarver et al., "Neural Network DPD via Backpropagation through a Neural Network Model of the PA", 53rd Asilomar Conference on Signals, Systems, and Computers, 2019, pp. 358-362.

Search Report received for corresponding Finnish Patent Application No. 20205611, dated Oct. 12, 2020, 2 pages.

Extended European Search Report received for corresponding European Patent Application No. 21177348.6, dated Oct. 15, 2021, 13 pages.

Qian et al., "A neural network predistorter for nonlinear power amplifiers with memory", Proceedings of 2002 IEEE 10th Digital Signal Processing Workshop, 2002 and the 2nd Signal Processing Education Workshop, Oct. 16, 2002, pp. 312-316.

Wang et al., "Augmented Real-Valued Time-Delay Neural Network for Compensation of Distortions and Impairments in Wireless Transmitters", IEEE Transactions on Neural Networks and Learning Systems, vol. 30, No. 1, Jan. 2019, pp. 242-254.

Jaraut et al., "Composite Neural Network Digital Predistortion Model for Joint Mitigation of Crosstalk, I/Q Imbalance, Nonlinearity in MIMO Transmitters", IEEE Transactions on Microwave Theory and Techniques, vol. 66, No. 11, Nov. 2018, pp. 5011-5020.

Brihuega et al., "Linearizing Active Antenna Arrays: Digital Predistortion Method and Measurements", IEEE MTT-S International Microwave Conference on Hardware and Systems for 5G and Beyond (IMC-5G), Aug. 15-16, 2019, 3 pages.

* cited by examiner

MACHINE LEARNING BASED DIGITAL PRE-DISTORTION FOR POWER AMPLIFIERS

TECHNICAL FIELD

The present application generally relates to power amplifiers. In particular, some example embodiments of the present application relate to machine learning based digital pre-distortion for power amplifiers.

BACKGROUND

Power amplifiers affect performance and throughput of communication systems. For example, non-linearity of a power amplifier may generate spectral re-growth, which may lead to adjacent channel interference and violation of out-of-band emission standards mandated by regulatory bodies. Furthermore, non-linearity may cause in-band distortion that degrades the error vector magnitude and ultimately the bit-error rate (BER) and data throughput. Machine learning (ML) or other automated processes may be utilized for different applications in different types of devices, such as for example mobile phones. In general, machine learning enables a computational model, for example a neural network, to be trained for performing a particular task on input data.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

Example embodiments improve determination of digital pre-distortion parameters for power amplifiers. This benefit may be achieved by the features of the independent claims. Further implementation forms are provided in the dependent claims, the description, and the drawings.

According to an aspect, an apparatus may comprise a transmitter configured to transmit a signal, wherein the transmitter comprises a power amplifier; an internal feedback receiver configured to receive the transmitted signal to obtain an internal feedback signal; a first machine learning model configured to emulate an external feedback receiver and to generate an emulated feedback signal based on the internal feedback signal; a second machine learning model configured to determine digital pre-distortion parameters for the power amplifier based on the emulated feedback signal.

According to an aspect, a method may comprise transmitting a signal, wherein the signal is amplified with a power amplifier; receiving, by an internal feedback receiver, the transmitted signal to obtain an internal feedback signal; emulating an external feedback receiver and generating an emulated feedback signal based on the internal feedback signal with a first machine learning model; determining digital pre-distortion parameters for the power amplifier based on the emulated feedback signal with a second machine learning model.

According to an aspect, system may comprise a reference device configured to transmit a set of test signals, the reference device comprising an internal feedback receiver configured to receive the set of test signals to obtain internal feedback signals; an external feedback receiver configured to receive the set of test signals to obtain external feedback signals; means for training a first baseline machine learning model to emulate the external feedback receiver and to generate emulated feedback signals based on the internal feedback signals, wherein the training of the first baseline model is based on the internal feedback signals and the external feedback signals received from the external feedback receiver; means for training a second baseline machine learning model to determine digital pre-distortion parameters for a power amplifier of the reference device based on the emulated feedback signals, wherein training of the second baseline machine learning model is based on the emulated feedback signals and the set of test signals.

According to an aspect, a method may comprise transmitting a set of test signals by a reference device, the reference device comprising an internal feedback receiver configured to receive the set of test signals to obtain a set of internal feedback signals; training a first baseline machine learning model to emulate an external feedback receiver and to generate emulated feedback signals based on the internal feedback signals, wherein the training of the first baseline model is based on the internal feedback signals and external feedback signals received from the external feedback receiver, the external feedback signals corresponding to the set of test signals; training a second baseline machine learning model to determine digital pre-distortion parameters for a power amplifier of the reference device based on the emulated feedback signals, wherein training of the second baseline machine learning model is based on the emulated feedback signals and the set of test signals.

According to an aspect, a computer program may comprise instructions for causing an apparatus to perform at least the following: transmitting a signal, wherein the signal is amplified with a power amplifier; receiving, by an internal feedback receiver, the transmitted signal to obtain an internal feedback signal; emulating an external feedback receiver and generating an emulated feedback signal based on the internal feedback signal with a first machine learning model; and determining digital pre-distortion parameters for the power amplifier based on the emulated feedback signal with a second machine learning model.

According to an aspect, a computer program may comprise instructions for causing an apparatus to perform at least the following: training a plurality of devices with a subset of test signals, wherein training of each device of the plurality of devices comprises: initializing an instance of the first machine learning model based on the first baseline machine learning model; initializing an instance of second machine learning model based on a subset of the second baseline machine learning model; training the instance of the first machine learning model to emulate the external feedback receiver and to generate emulated feedback signals based on device-specific internal feedback signals received from an internal feedback receiver of the device, wherein the training of the instance of the first machine learning model is based on the device-specific internal feedback signals and the external feedback signals received from the external feedback receiver; and training the instance of the second machine learning model to determine digital pre-distortion parameters for a power amplifier of the device based on the emulated feedback signals, wherein training of the instance of the second machine learning model of is based on the emulated feedback signals and the subset of test signals.

According to an aspect, an apparatus may comprise at least one processor; and at least one memory including computer program code; the at least one memory and the computer program code configured to, with the at least one processor, cause the apparatus at least to: transmit, by a transmitter, a signal, wherein the transmitter comprises a power amplifier; receive, by an internal feedback receiver, the transmitted signal to obtain an internal feedback signal; emulate, by a first machine learning model, an external feedback receiver and to generate, by the first machine learning model, an emulated feedback signal based on the internal feedback signal; and determine, by a second machine learning model, digital pre-distortion parameters for the power amplifier based on the emulated feedback signal.

Many of the attendant features will be more readily appreciated as they become better understood by reference to the following detailed description considered in connection with the accompanying drawings.

DESCRIPTION OF THE DRAWINGS

The accompanying drawings, which are included to provide a further understanding of the example embodiments and constitute a part of this specification, illustrate example embodiments and together with the description help to explain the example embodiments. In the drawings.

Like references are used to designate like parts in the accompanying drawings.

DETAILED DESCRIPTION

Reference will now be made in detail to example embodiments, examples of which are illustrated in the accompanying drawings. The detailed description provided below in connection with the appended drawings is intended as a description of the present examples and is not intended to represent the only forms in which the present examples may be constructed or utilized. The description sets forth the functions of the example and a possible sequence of steps for constructing and operating the example. However, the same or equivalent functions and sequences may be accomplished by different examples.

Non-linearities of power amplifiers may cause various adverse effects. To reduce non-linearity, a power amplifier may be operated at low power, for example in a back-off mode within a linear portion of its operating curve. However, some transmission systems such as for example wideband code division multiple access (WCDMA) systems and orthogonal frequency division multiplexing (OFDM) systems, for example wireless local area networks (WLAN), $3^{rd}$ Generation Partnership Project (3GPP) Long-Term Evolution (LTE), 3GPP 5G New radio (NR), may cause the transmitted signal to have high peak-to-average power ratio (PAPR), that is, to have large variations in the signal waveform. Therefore, the power amplifier may need to be backed off significantly below its maximum saturated output power to avoid distortion of the high peaks. This may result in low efficiency, for example less than 10%. With more than 90% of power being lost and turning into heat, the amplifier performance, reliability and operating expenses may be severely degraded. Therefore, example embodiments of the present disclosure provide machine learning based digital pre-distortion methods for linearization of power amplifiers.

According to an example embodiment, an apparatus may amplify a signal with a power amplifier and transmit the signal. The signal may be received by an internal feedback receiver of the apparatus. The apparatus may further comprise a first machine learning model configured to emulate an external high-quality feedback receiver and to generate an emulated feedback signal based on the internal feedback signal. The external high-quality feedback receiver may be used during production phase to train the first machine learning model to mimic the external feedback signal based on the internal feedback signal. The apparatus may further comprise a second machine learning model configured to determine digital pre-distortion parameter(s) for the power amplifier based on the emulated feedback signal. Therefore, sufficient quality of feedback signals may be maintained regardless of the more limited capabilities of the internal feedback receiver and thereby the linearity of the power amplifier is improved also after deployment of the apparatus in the field.

Figure 1:
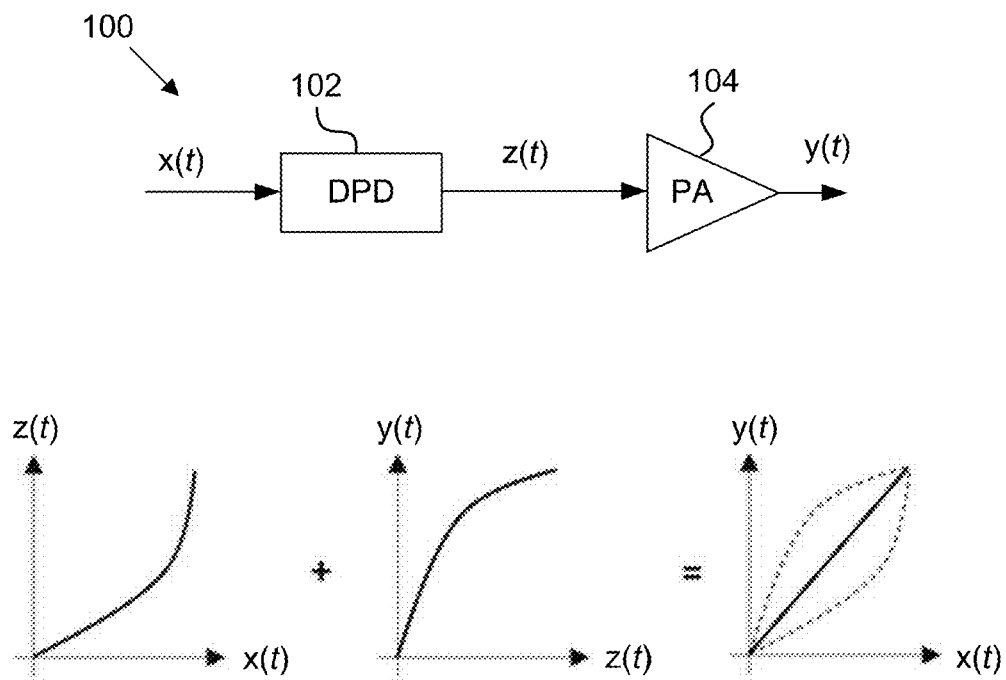
FIG. 1 illustrates an example of digital pre-distortion system, according to an example embodiment.

FIG. 1 illustrates an example of digital pre-distortion system 100, according to an example embodiment. The digital pre-distortion system 100 may be embodied on an apparatus, for example a transmitter. An input signal x(t) may be provided to a digital pre-distorter (DPD) 102, which may be configured to produce an expanding non-linearity to the pre-distorted signal z(t) that complements the compressing non-linearity of the power amplifier (PA) 104. As a result, the output y(t) of the cascaded DPD 102 and PA 104 is linearized with respect to the input x(t), as illustrated in FIG. 1. In an ideal case, y(t) is strictly linear with respect to x(t). It is however appreciated that in practical applications linearization of a power amplifier may comprise causing an output of the power amplifier to be substantially or sufficiently linear, for example for a particular application. With DPD 102, the PA 104 may be utilized up to its saturation point while still maintaining sufficient linearity. Consequently, also the output power capability of the transmitter may be increased for a given linearity target, or, the improved linearity may be used to increase efficiency of the transmitter at a given back-off output power, for example by re-biasing the PA 104 for a lower saturation point. The DPD 102 may approximate an inverse of the PA 104.

DPD 102 may be implemented based on memoryless models that are suitable for power amplifiers with memoryless non-linearity. In this case, the output of the PA 104 may depend on the current input. This instantaneous non-linearity may be characterized by the AM/AM (amplitude modulation/amplitude modulation) and AM/PM (amplitude modulation/phase modulation) responses of the PA 104, where the output signal amplitude and phase deviation of the power amplifier output may be provided as functions of the amplitude of its current input. For example memoryless polynomial or look-up table (LUT) based algorithms may be used to implement memoryless models.

However, a simple memoryless model may not be sufficient for systems with wide bandwidth, where power amplifiers may have memory effects, for example due to thermal constants of active devices or biasing components having frequency dependent behavior. The output of the PA 104 may additionally depend on past input values and therefore a memoryless DPD 102 may not be able to sufficiently linearize the PA 104.

An approach for linearizing such power amplifiers is to apply DPDs comprising memory structures. Examples of such algorithms include Volterra series-based algorithms and it's derivatives such as for example Wiener, Hammerstein, Wiener-Hammerstein, or parallel Wiener structures and memory polynomial models.

An approach to construct a DPD 102 with memory is to find an inverse of the PA 104 directly (DLA, direct learning architecture). However, it may not be straightforward to obtain an inverse of a non-linear system with memory. Another approach is indirect learning architecture (IDLA), which enables to avoid model assumption and parameter estimation of the PA 104.

Figure 2:
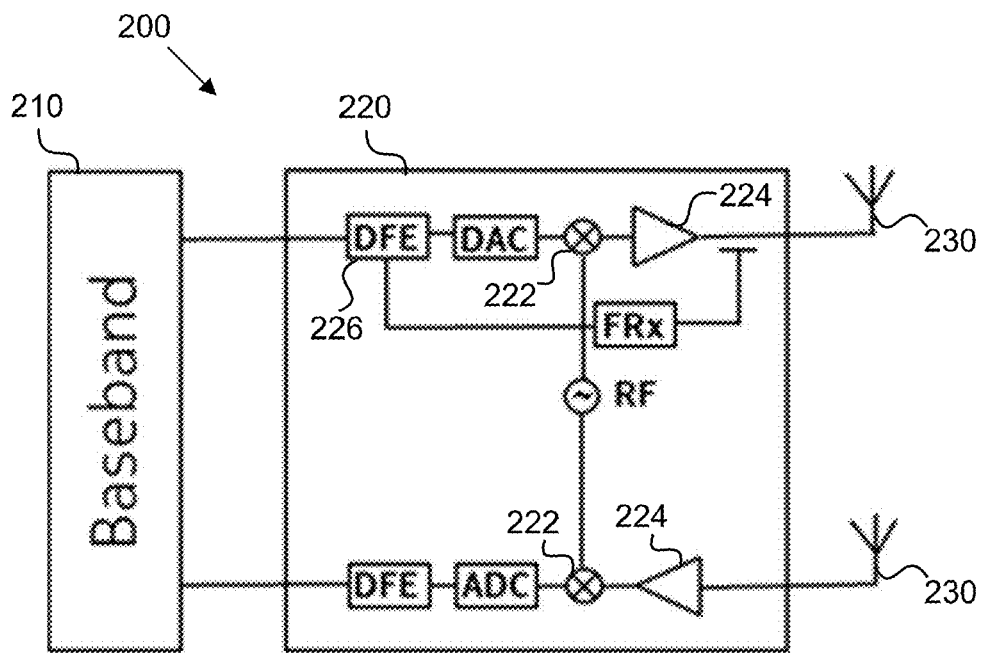
FIG. 2 illustrates an example of a digital pre-distortion system for limited bandwidths below 6 GHz, according to an example embodiment.

FIG. 2 illustrates an example of a digital pre-distortion system 200 for limited bandwidths below 6 GHz, according to an example embodiment. This example DPD system may be suitable for example for frequencies below 6 GHz and with limited signal bandwidth (e.g. <100 MHz). A device, such as for example a user equipment (UE) of a cellular communication system, may comprise baseband circuitry 210 and RF (radio frequency) circuitry 220. The RF circuitry 220 may comprise digital-front end(s) (DFE), digital-to-analog (DAC) and analog-to-digital (ADC) converters, mixer(s) 222, and power amplifier(s) PA(s) 224. One or more RF oscillators may be coupled to the mixer(s) 222. The RF circuitry 220 may be configured to communicate RF signals via antenna(s) 230. The DPD system 200 may be based on transmission of a known reference signal at the factory. A built-in feedback receiver (FRx) may be configured to capture the transmitted signal and transfer the signal back to the baseband circuitry 210, for example via DFE 226, for calculation of DPD coefficients. This solution may be applied when significant changes in performance, for example due to aging or external environmental effects in the field, are not expected, or, if sufficient power back-off is incorporated to absorb the environmental effects and to maintain compliance with specifications.

Figure 3:
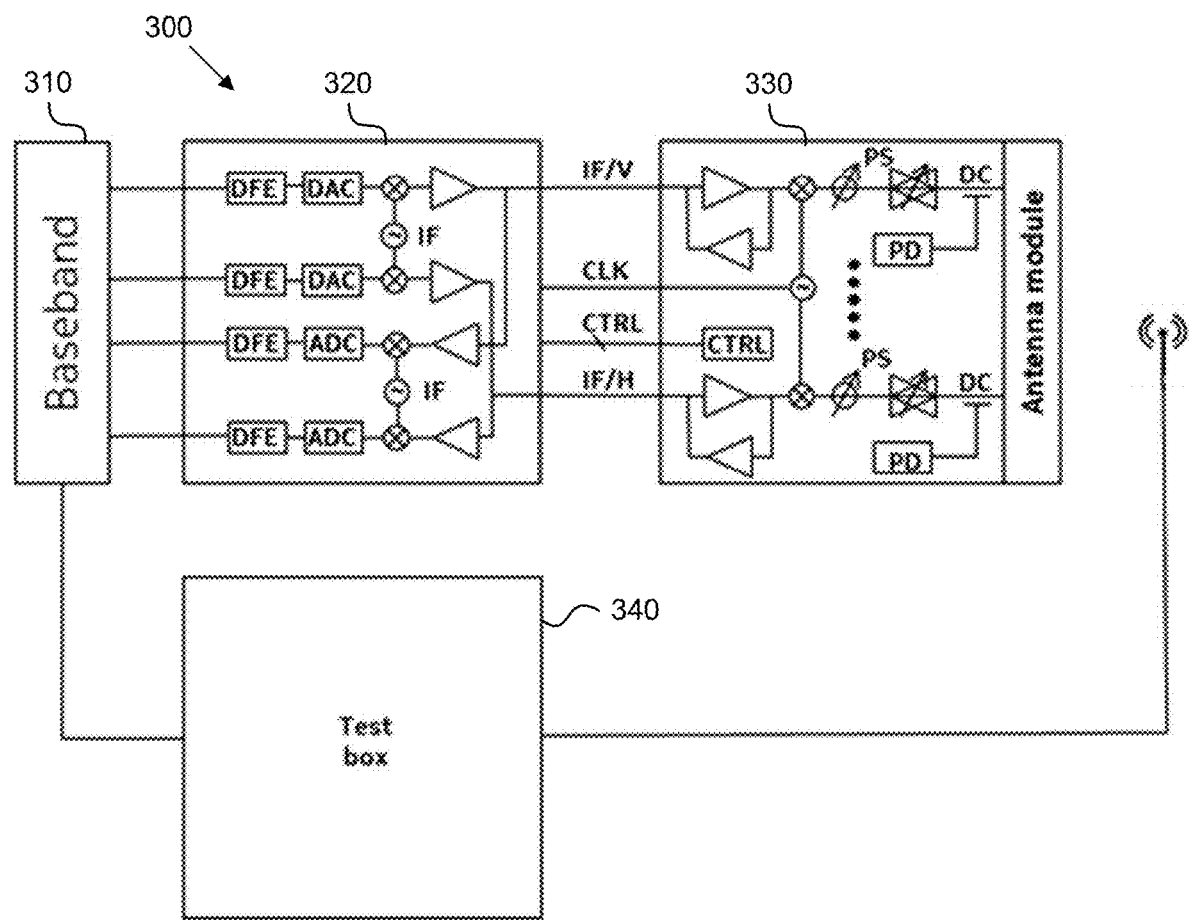
FIG. 3 illustrates an example of a digital pre-distortion system for high bandwidth and millimeter wave support, according to an example embodiment.

FIG. 3 illustrates an example of a digital pre-distortion system for high bandwidth and millimeter wave (mmWave) support, according to an example embodiment. A device, for example a UE, may comprise baseband circuitry 310, intermediate frequency (IF) circuitry 320, and RF circuitry 330. The IF circuitry 320 may comprise DFEs, DACs, mixers, IF oscillators, and/or power amplifiers in order to provide and receive IF signal (IF/V, IF/H) to/from the RF circuitry 330. Furthermore, a clock signal (CLK) and control data (CTRL) may be exchanged between the IF circuitry 320 and RF circuitry 330. The RF circuitry 330 may comprise any suitable components, such as for example PAs, mixers, RF oscillators, phase shifters (PS), and power detectors (PD), to transmit and receive signals via an antenna module coupled to the RF circuitry 330.

The DPD system 300 may further comprise external test equipment 340 (test box). The external test equipment 340 may be configured to capture the transmitted signal with a bandwidth which is higher than the bandwidth of the transmitted signal, for example up to three times higher. The external test equipment 340 may transfer the signal back to the baseband circuitry 310 for calculation of the DPD coefficients. However, while this solution enables more accurate calculation of the DPD coefficients, it does not take into account dynamic variations such as for example changing loading effects during live operation after deployment of the device in the field. In such a case, a static set of DPD coefficients may not provide sufficient accuracy. Furthermore, using a system similar to FIG. 2 may not be possible since it may not be possible to capture sufficiently large bandwidths with required dynamic range with an in-built feedback receiver online during operation in the field. Therefore, for example the antenna loading effects might not be captured appropriately using a feedback receiver (FRx) similar to FIG. 2.

In general, methods for determining DPD parameters, for example mmWave DPD (mDPD) coefficients, may be adversely affected by the following factors:

1) High bandwidth. At high bandwidths a PA may exhibit memory effects and therefore data representative of exhaustive live operation conditions may be needed for characterization of the PA. furthermore, the number of DPD coefficients may be significantly higher compared to DPDs without memory effects (e.g. due to lower bandwidth). For example, mmWave in 5G NR Release 15 is defined as 400 MHz with carrier aggregation (CA) options such that even early devices may support 400-1200 MHz bandwidth. In DPD applications, the measurement bandwidth for DPD characterization may be even >3× higher than the transmitted signal bandwidth. Therefore, a high dynamic range measurement receiver on silicon with 2.4-3.6 GHz bandwidth may be unrealistic.

2) Antenna load effects: For mmWave operation, the antennas may comprise active antennas built in the final industrial design. This means that a user operating the device is likely to touch the antennas (or the material covering the antennas) and thereby affect the antenna load. Once the antenna load changes, the PA characteristics are impacted and the DPD coefficients may need to be updated. Consequently, a static solution characterized in a lab or production line may not be adequate. If live operation of DPD training is not supported, the PA design may need to build in an extensive buffer power headroom for load mismatch scenarios, which results in suboptimum performance compared to normal conditions.

3) Device reference signals. Due to spurious emission requirements, a UE may be required not to transmit beyond approximately −47 dBm/1 MHz, unless allowed for example by the 3GPP specifications. A well suited non-3GPP standard UE TX reference/test signal may be used to characterize the PA behavior. Power of this test signal may need to be representative of a live UL transmission to place the PA in the correct large signal conditions during training. This may possible only in a lab or UE production setup as the final device may not be able to use such large reference/test signals in the field.

4) Online measurements: A device may be operated in a SISO (single input-single output) mode during PA and mDPD characterization. This enables the UE to transmit on one MIMO (multiple input-multiple output) branch and use the other MIMO branch for receiving feedback signals in order to perform PA characterization. However, for uplink MIMO such solution may not work since both available TX branches may be occupied.

Therefore, example embodiments disclosed herein provide a machine learning (ML) based DPD architecture that may enable more accurate determination of DPD parameters after deployment of a UE in the field. The example embodiments may be applied for example for systems where the bandwidth of an in-built feedback receiver is not sufficient for accurate determination of DPD parameters. The example embodiments enable taking into account antenna loading effects and ageing effects, emulating high-fidelity, e.g. high resolution (large bandwidth) feedback signals in absence of external test equipment, using a phased training approach where an architecture of a reference device may be transferred to different UEs during production and in the field, and triggering online training once the UE is operating in the field.

Figure 4:
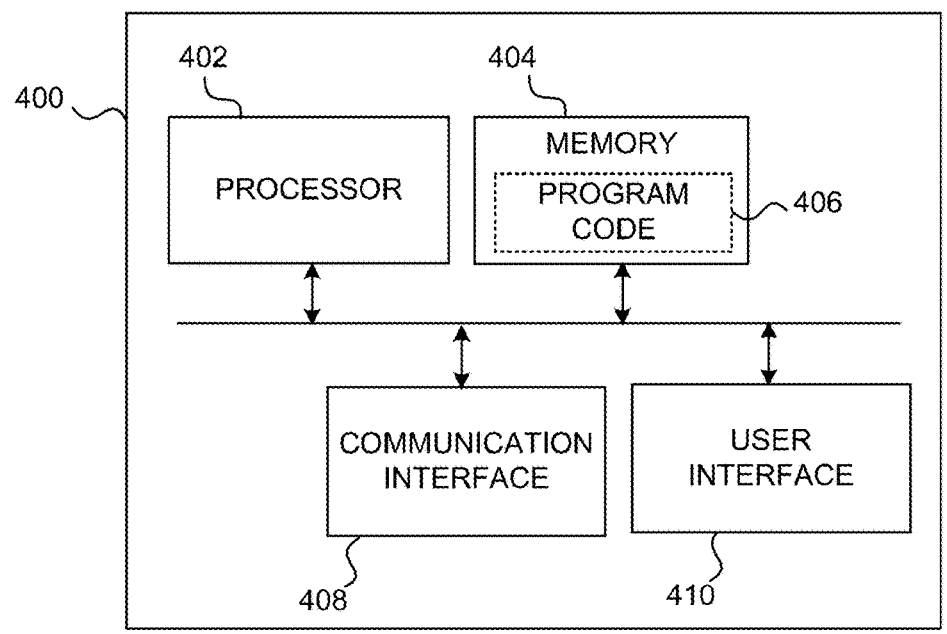
FIG. 4 illustrates an example of an apparatus configured to practice one or more example embodiments.

FIG. 4 illustrates an example of an apparatus 400 configured to practice one or more example embodiments. Apparatus 400 may comprise at least one processor 402. The at least one processor may comprise, for example, one or more of various processing devices, such as for example a co-processor, a microprocessor, a controller, a digital signal processor (DSP), a processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, or the like.

The apparatus may further comprise at least one memory 404. The memory may be configured to store, for example, computer program code or the like, for example operating system software and application software. The memory may comprise one or more volatile memory devices, one or more non-volatile memory devices, and/or a combination thereof. For example, the memory may be embodied as magnetic storage devices (such as hard disk drives, floppy disks, magnetic tapes, etc.), optical magnetic storage devices, or semiconductor memories (such as mask ROM, PROM (programmable ROM), EPROM (erasable PROM), flash ROM, RAM (random access memory), etc.).

Apparatus 400 may further comprise communication interface 408 configured to enable apparatus 400 to transmit and/or receive information, for example signals according to one or more wireless communication standards. The communication interface 408 may be configured to provide at least one wireless radio connection, such as for example a 3GPP mobile broadband connection (e.g. 3G, 4G, 5G); a wireless local area network (WLAN) connection such as for example standardized by IEEE 802.11 series or Wi-Fi alliance; a short range wireless network connection such as for example a Bluetooth, NFC (near-field communication), or RFID connection; a local wired connection such as for example a local area network (LAN) connection or a universal serial bus (USB) connection, or the like; or a wired Internet connection.

Apparatus 400 may further comprise a user interface 410 comprising an input device and/or an output device. The input device may take various forms such a keyboard, a touch screen, or one or more embedded control buttons. The output device may for example comprise a display, a speaker, a vibration motor, or the like.

When the apparatus is configured to implement some functionality, some component and/or components of the apparatus 400, such as for example the at least one processor 402 and/or the memory 404, may be configured to implement this functionality. Furthermore, when the at least one processor 402 is configured to implement some functionality, this functionality may be implemented using program code 406 comprised, for example, in the memory 404.

The functionality described herein may be performed, at least in part, by one or more computer program product components such as software components. According to an example embodiment, the apparatus comprises a processor or processor circuitry, such as for example a microcontroller, configured by the program code when executed to execute the embodiments of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAs), application-specific Integrated Circuits (ASICs), application-specific Standard Products (ASSPs), System-on-a-chip systems (SOCs), Complex Programmable Logic Devices (CPLDs), Graphics Processing Units (GPUs).

The apparatus 400 may comprise means for performing at least one method described herein. In one example, the means comprises the at least one processor 402, the at least one memory 404 including program code 406, the at least one memory 404 and the program code 406 configured to, with the at least one processor 402, cause the apparatus 400 to perform the method(s).

Apparatus 400 may comprise a computing device such as for example mobile phone, a tablet computer, a laptop, an internet of things (IoT) device, or the like. Examples of IoT devices include, but are not limited to, consumer electronics, wearables, and smart home appliances. In one example, apparatus 400 may comprise a vehicle such as for example a car. Although apparatus 400 is illustrated as a single device it appreciated that, wherever applicable, functions of apparatus 400 may be distributed to a plurality of devices, for example to implement example embodiments as a cloud computing service.

Figure 5:
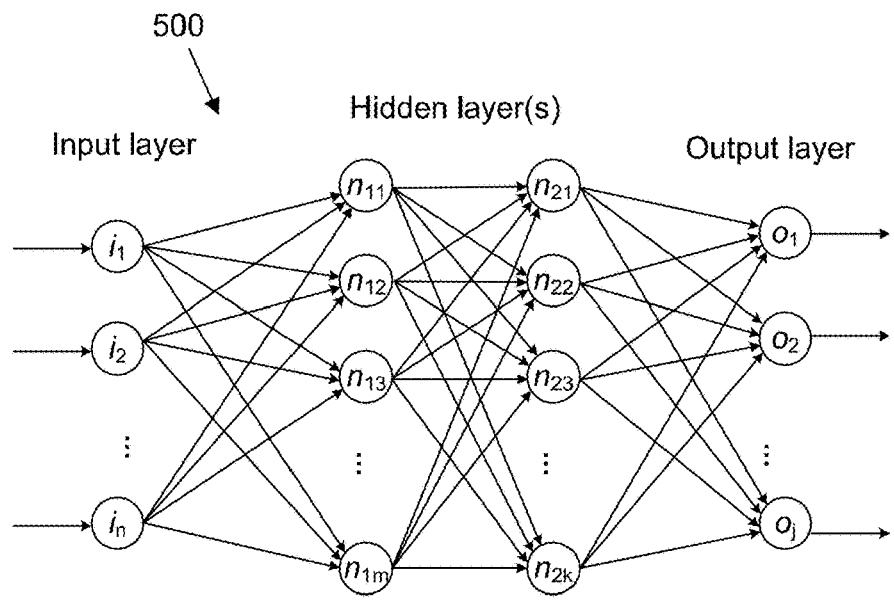
FIG. 5 illustrates an example of a neural network, according to an example embodiment.

FIG. 5 illustrates an example of a neural network, according to an example embodiment. A neural network may comprise a computation graph with several layers of computation. For example, neural network 500 may comprise an input layer, one or more hidden layers, and an output layer. Nodes of the input layer, $i_1$ to $i_n$, may be connected to one or more of the m nodes of the first hidden layer, $n_{11}$ to $n_{1m}$. Nodes of the first hidden layer may be connected to one or more of the k nodes of the second hidden layer, $n_{21}$ to $n_{2k}$.

It is appreciated that even though the example neural network of FIG. 5 illustrates two hidden layers, a neural network may apply any number and any type of hidden layers. Neural network 500 may further comprise an output layer. Nodes of the last hidden layer, in the example of FIG. 5 the nodes of the second hidden layer, $n_{21}$ to $n_{2k}$, may be connected to one or more nodes of the output layer, $o_1$ to $o_j$. It is noted that the number of nodes may be different for each layer of the network. A node may be also referred to as a neuron, a computation unit, or an elementary computation unit. Terms neural network, neural net, network, and model may be used interchangeably. A machine learning model or algorithm may comprise a neural network, but a machine learning model may be also implemented as any other suitable learnable model. Weights of the neural network may be referred to as learnable parameters or simply as parameters. In the example of FIG. 5, one or more of the layers may be fully connected layers, for example layers where each node is connected to every node of a previous layer.

Feed-forward neural network is an example a neural network architecture. In feed-forward neural networks there may not be any feedback loop. Each layer may take input from one or more preceding layers and provide its output to one or more of the subsequent layers. Also, individual nodes inside certain layers may take input from nodes in one or more preceding layers and provide output to nodes of one or more subsequent layers. In a linear-bypass network architecture, one or more nodes of the input layer may be connected to one or more nodes of the output layer. In the application of digital pre-distortion for power amplifiers this enables the hidden layers to focus on compensating for the non-linearities of the power amplifier.

Figure 6:
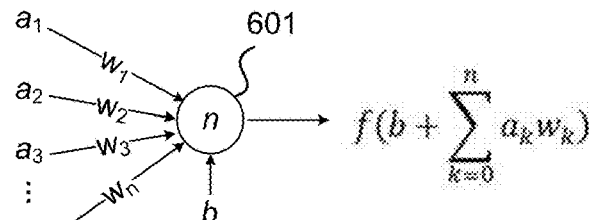
FIG. 6 illustrates an example of an elementary computational unit, according to an example embodiment.

FIG. 6 illustrates an example of a node 601 of a neural network, according to an example embodiment. The node 601 may be configured to receive one or more inputs, $a_1$ to $a_n$, from one or more nodes of one or more preceding layers and compute an output based on the input values received. In general, a node may also receive feedback from one or more nodes of one or more subsequent layers. Inputs may be associated with parameters to adjust the influence of a particular input to the output. For example weights $w_1$ to $w_n$ associated with the inputs $a_1$ to $a_n$ may be used to multiply the input values $a_1$ to $a_n$. The node 601 may be further configured combine the inputs to an output, or an activation. For example, the node 601 may be configured to sum the modified input values. A bias or offset b may be also applied to add a constant to the combination of modified inputs. Weights and biases may be learnable parameters. For example, when the neural network is trained for a particular task or for particular circumstances, the values of the weights and/or biases associated with different inputs and different nodes may be updated such that an error associated with performing the task is reduced to an acceptable level.

Furthermore, an activation function f( ) may be applied to control when and how the node 601 provides the output. Activation function may be for example a non-linear function that is substantially linear in the region of zero but limits the output of the node when the input increases or decreases. Examples of activation functions include, but are not limited to, a step function, a sigmoid function, a tan h function, a ReLu (rectified linear unit) function, and a softmax function. The output may be provided to nodes of one or more following layers of the network, and/or to one or more nodes of one or more previous layers of the network.

A forward propagation or a forward pass may comprise feeding a set of input data through the layers of the neural network 500 and producing an output. During this process the weights and biases of the neural network 500 affect the activations of individual nodes and thereby the output provided by the output layer.

One property of neural networks and other machine learning tools is that they are able to learn properties from input data, for example in supervised way or in unsupervised way. Learning may be based on teaching the network by a training algorithm or based on a meta-level neural network providing a training signal.

In general, a training algorithm may include changing some properties of the neural network such that its output becomes as close as possible to a desired output. For example, in the case of DPD parameter generation, a neural network may be trained to provide an output that causes a desired (linear) output with a reference power amplifier. During training the generated output may be compared to the desired output to compute an error value or a loss value. The error may be calculated based on a loss function. Updating the neural network may be then based on calculating a derivative with respect to learnable parameters of the network. This may be done for example using a back-propagation algorithm that determines gradients for each layer starting from the final layer of the network until gradients for the learnable parameters have been obtained. Parameters of each layer may be then updated accordingly such that the loss is iteratively decreased. An example of a loss is the mean squared error (MSE) between the output of the system the desired output data. In deep learning, training may comprise an iterative process, where at each iteration the algorithm modifies parameters of the neural network to make a gradual improvement of the network's output, that is, to gradually decrease the loss.

Figure 7:
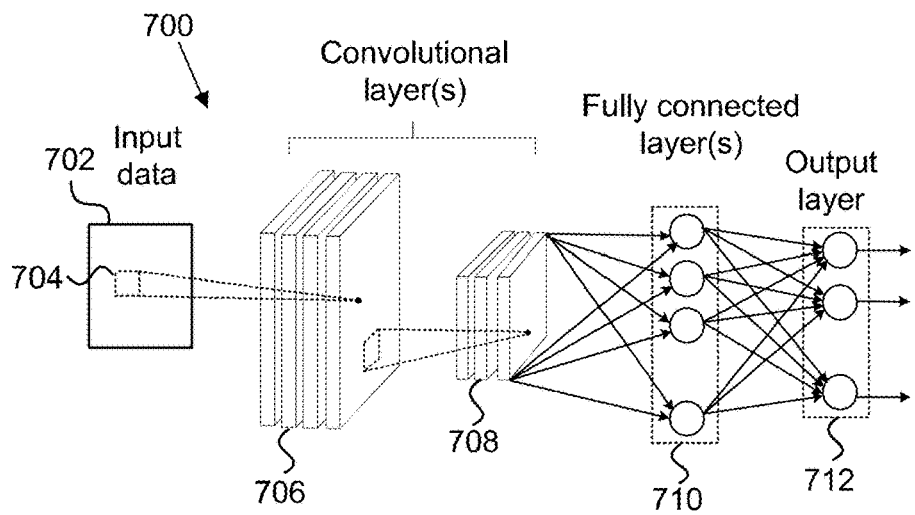
FIG. 7 illustrates an example of a convolutional neural network, according to an example embodiment.

FIG. 7 illustrates an example of a convolutional neural network 700. A convolutional neural network 700 comprises at least one convolutional layer. A convolutional layer may perform convolutional operations to extract information from input data 702 to form a plurality of feature maps 706. A feature map may be generated by applying a filter or a kernel to a subset of input data, for example block 704 of the input data 702, and sliding the filter through the input data to obtain a value for each element of the feature map. The filter may comprise a matrix or a tensor, which may be for example multiplied with the input data to extract features corresponding to that filter. A plurality of feature maps may be generated based on applying a plurality of filters. A further convolutional layer may take as input the feature maps from a previous layer and apply the same filtering principle on the feature maps 706 to generate another set of feature maps 708. Weights of the filters may be learnable parameters and they may be updated during a training phase, similar to parameters of neural network 500 Similar to node 601, an activation function may be applied to the output of the filter(s). The convolutional neural network 700 may further comprise one or more other type of layers such as for example fully connected layers 710 before, after, and/or between the convolutional layers. An output may be provided by an output layer 712. For a DPD parameter generation task the input may comprise signal samples from an in-built feedback receiver, as will be further discussed below. The output may comprise the DPD coefficients adapted to characteristics of the power amplifier.

Figure 8:
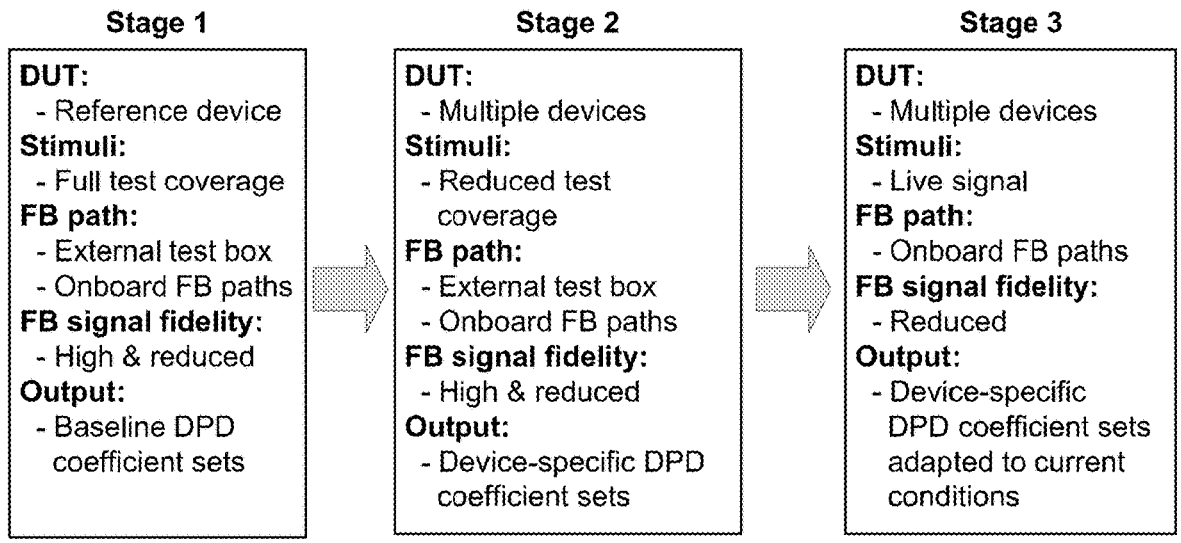
FIG. 8 illustrates an example of a three-stage approach for digital pre-distortion calibration, according to an example embodiment.

FIG. 8 illustrates an example of a three-stage approach for digital pre-distortion calibration, according to an example embodiment. Stage 1 may comprise a lab characterization stage. Stage 1 may be performed on a reference device or a group of reference devices, for example in a laboratory environment before initiating mass production. In other words, at this stage the device under test (DUT) may be the reference device. A reference device may be also referred to as a reference unit, a Golden unit, or a reference UE. A target of Stage 1 may be to train a first machine learning model to mimic a high-fidelity (hi-fi) feedback signal based on a reduced fidelity feedback signal. Another target is to train a second ML model to learn the behavior of the PA of the reference device. The first and/or second ML models may be used as baseline ML model(s) for subsequent fine-tuning of corresponding ML model(s) in different devices.

Stage 1 may comprise training the ML models with the reference device over a diverse set of parameters, for example an exhaustive training over configured ranges for a set of parameters. Therefore, at Stage 1 the stimuli may comprise the full test coverage. The feedback (FB) paths may include the feedback path via an external test box (cf. external test equipment 340) and from an in-built feedback receiver over onboard feedback paths. The external test box may provide a high-fidelity signal and the in-built feedback receiver may provide a reduced fidelity signal. For example, the hi-fi signal may be captured with a higher bandwidth than the reduced fidelity signal. An output of Stage 1 may comprise baseline DPD coefficient sets.

Stage 2 may comprise a UE production test. At Stage 2, the training approach of Stage 1 may be applied to a plurality of devices, for example all UEs under production. However, the stimuli may comprise a reduced test coverage, for example a subset of the parameters or ranges of parameters used at Stage 1. The feedback paths may comprise the paths from the external test box and the onboard feedback paths, similar to Stage 1. Therefore, both high and reduced fidelity signals may be used. During Stage 2, the baseline ML model(s) may be adapted for characteristics of each device. Therefore, an output of Stage 2 may comprise device-specific DPD coefficient sets.

Stage 3 may comprise a field online adjustment stage. Stage 3 may be performed at one or more of the plurality of devices. At this stage, the devices may be already deployed in the field and in use by the customers or users. Therefore, the stimuli comprises the live transmission signal and the feedback paths include the onboard feedback paths. The feedback path via the external test box may not be available. Hence, the device may need to perform the field online adjustment by re-training the first and/or second ML models based on the reduced fidelity signal. Reliable re-training based on the reduced fidelity feedback signal is enabled by the first ML model that was trained in Stages 1 and 2 to mimic the output of the external test box, that is, the hi-fi signal. An output of Stage 3 may comprise device-specific DPD coefficients adapted to current conditions.

Figure 9:
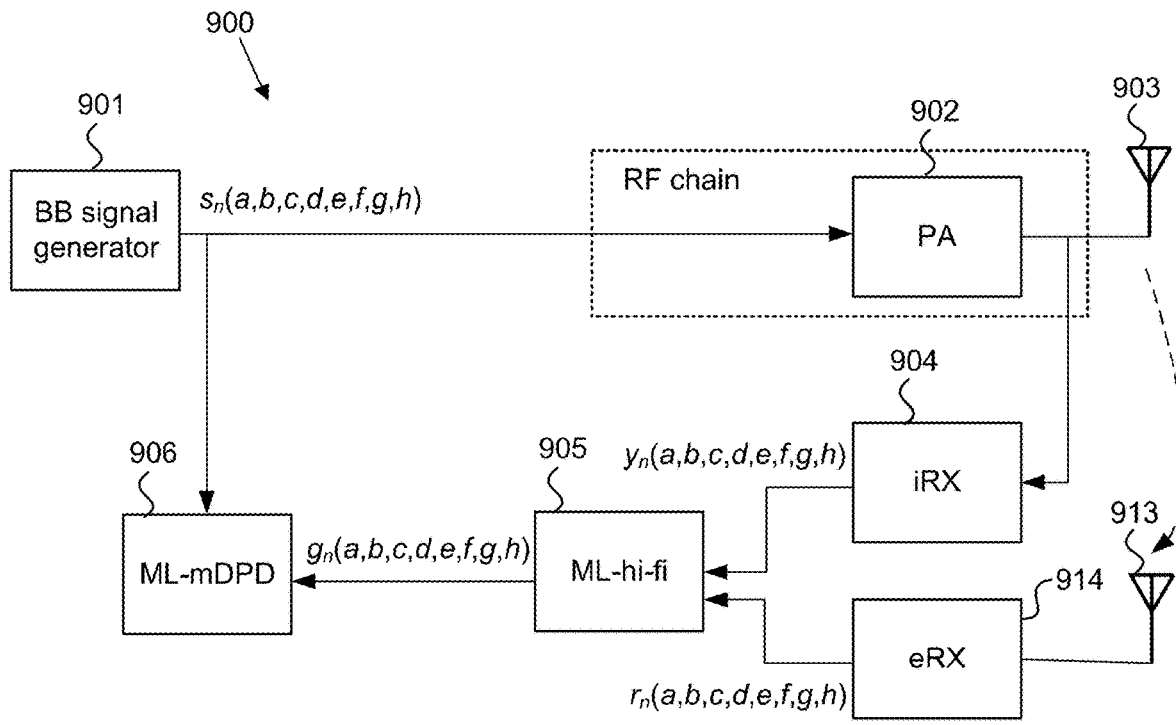
FIG. 9 illustrates an example of a system for training a machine learning based digital pre-distortion model.

FIG. 9 illustrates an example of a system for training a machine learning based digital pre-distortion model, according to an example embodiment. The system 900 may comprise a baseband signal generator configured to generate a signal, e.g. a test signal $s_n$. The signal may comprise a baseband signal. The signal may be characterized by one or more signal related or environment related parameters, such as for example at least one of transmit power, signal bandwidth, beam configuration, modulation and/or error correction coding scheme, carrier frequency, temperature, battery level, or antenna load. Hence, the signal may be denoted by $s_n(a,b,c,d,e,f,g,h)$, where the arguments a-h represent the signal parameters. In this example embodiment the number of parameters is 8, however the number of parameters may vary. The baseband signal generator 901 may generate a set of test signals with varying parameters and/or parameter values.

An RF chain of the system may comprise a power amplifier 902, which may cause non-linearities in the signal. Therefore, the system 900 may comprise an internal feedback receiver 904 (iRX) configured to receive the transmitted signal to obtain an internal feedback signal $y_n(a,b,c,d,e,f,g,h)$. The power amplified signal may be radiated by means of an antenna 903. However, the iRX 904 may receive the power amplified signal internally, without a radio interface. The iRX 904 may be also referred to as an in-built (feedback) receiver or an intrinsic (feedback) receiver.

The system 900 may further comprise an external feedback receiver 914 (eRX), which may be configured to receive the signal over a radio interface, for example via an antenna 913, to obtain an external feedback signal $r_n(a,b,c,d,e,f,g,h)$. The eRX 914 may be also referred to as an extrinsic (feedback) receiver. The eRX 914 may be configured to receive a set of test signals to obtain multiple external feedback signals, for example during Stages 1 and 2.

The system 900 may further comprise a first machine learning model, ML-hi-fi model 905 (ML high-fidelity model). The ML-hi-fi model 905 may be configured to emulate the eRX 914 and to generate an emulated feedback signal $g_n(a,b,c,d,e,f,g,h)$ based on the internal feedback signal $y_n(a,b,c,d,e,f,g,h)$. The emulated feedback signal $g_n(a,b,c,d,e,f,g,h)$ may comprise a regenerated version of the signal received by the eRX 914 via antenna 913.

As discussed above, capabilities of iRX 904 may be more limited than capabilities of the eRX 914. For example, the eRX 914 may be located at external test equipment that is not limited for example with respect to cost or size. By contrast, the iRX 914 may be located at the device under test (DUT), for example a mobile phone. For example, the bandwidth of the iRX 904 may be lower than the bandwidth of the eRX 914. Also, the dynamic range of the iRX 904 may be lower than the dynamic range of the eRX 914. The iRX 904 may be also inferior with respect to one or more other parameters. Therefore, the ML-hi-fi model 905 may be in Stages 1 and 2 trained to mimic the external feedback signal provided by eRX 914.

Training of ML-hi-fi model 905 may comprise receiving the external feedback signal $r_n(a,b,c,d,e,f,g,h)$ from the eRX 914. Training of ML-hi-fi model 905 may be based on the internal feedback signal $y_n(a,b,c,d,e,f,g,h)$ and the external feedback signal $r_n(a,b,c,d,e,f,g,h)$. Training the ML-hi-fi model 905 to mimic the eRX 914 may be for example based on a generative adversarial network (GAN) approach, as will be further described in relation to FIG. 10. However, also other ML methods that interpolate and/or extrapolate samples may be used. The output $g_n(a,b,c,d,e,f,g,h)$ of the ML-hi-fi model 905 may comprise a regenerated high-fidelity signal that approximates $r_n(a,b,c,d,e,f,g,h)$.

The system 900 may further comprise a second machine learning model, ML-mDPD model 906 (ML mmWave digital pre-distortion model). The ML-mDPD model 906 may be configured to determine at least one digital pre-distortion parameter for the power amplifier 902 based on the emulated feedback signal $g_n(a,b,c,d,e,f,g,h)$. The ML-mDPD model 906 may be implemented in any suitable manner, for example as a cascade of deep neural networks that may be trained to learn a composite PA response and an inverse of the composite PA response, as will be further discussed in relation to FIG. 11. The power amplifier 902 may be linearized based on the digital pre-distortion parameters determined by the ML-mDPD model 906. For example, the digital pre-distortion parameters may comprise a subset or a portion of the ML-mDPD 906, as will be further discussed in relation to FIG. 11.

In Stage 1, the DUT may comprise a reference device. Hence, the reference device may comprise the BB signal generator 901, the PA 902, the antenna 903, the iRX 904, the ML-hi-fi model 905, and the ML-mDPD model 906. During Stage 1, the reference device may be configured to transmit a set of test signals. The iRX 904 of the reference device may be configured to receive the set of test signals to obtain internal feedback signals. A first baseline machine learning model, for example a baseline ML-hi-fi model, may be then trained to emulate the eRX 914. The baseline ML-hi-fi model may be further trained to generate emulated feedback signals based on the internal feedback signals. Training of the baseline ML-hi-fi model may be based on the internal feedback signals and the external feedback signals received from the eRX 914 of the reference device.

Furthermore, a second baseline ML model, for example baseline ML-mDPD, may be trained to determine at least one digital pre-distortion parameter for the PA 902 of the reference device based on the emulated feedback signals. Training of the baseline ML-mDPD model may be based on the emulated feedback signals, $g_n(a,b,c,d,e,f,g,h)$, and the set of test signals, $s_n(a,b,c,d,e,f,g,h)$. In inference phase, e.g. when using the model after deployment, the baseline ML-mDPD 906 may take as input the emulated feedback signal $g_n$ and provide as output the digital pre-distortion parameters for linearizing the PA 902. The output may comprise a subset or a portion of the trained ML-mDPD model 906.

Figure 10:
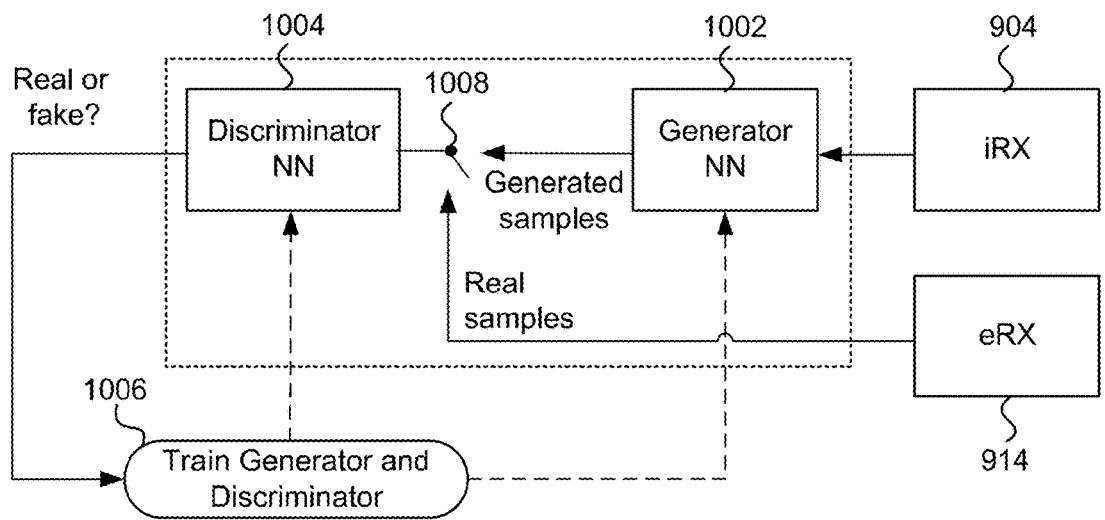
FIG. 10 illustrates an example of applying a general adversarial neural network (GAN) for training a digital pre-distortion system, according to an example embodiment.

FIG. 10 illustrates an example of applying a general adversarial neural network (GAN) for training a digital pre-distortion system, according to an example embodiment. The GAN may comprise a generator neural network 1002 configured to take as input the internal feedback signal(s) from iRX 904. The GAN may further comprise a discriminator neural network 1004 configured to take as input either generated samples from the generator neural network 1002 or real samples from the eRX 914, representing real sample, or ground-truth data. The discriminator neural network 1004 may be configured to alternately take input from the eRX 914 and the generator neural network 1002. The task of the discriminator neural network 1004 is to estimate whether its input was real or fake, i.e. whether the input was from eRX 914 or the generator neural network 1002.

At 1006, the generator 1002 and discriminator 1004 may be trained based on whether the discriminator 1004 correctly estimated the source of the input sample. The correct source may be determined based on position of the switch 1008, which is known. The discriminator 1004 may be rewarded for correctly estimating the source of the input sample and the generator 1002 may be rewarded for fooling the discriminator 1004, for example when the discriminator 1004 makes a wrong estimation. A reward may be determined based on a function, which may be dependent of the state and the action an agent, for example the discriminator 1004, takes. The reward function, or approximations thereof, may take any suitable form. Fooling may refer to the fact that the generator 1002 is able to create a fake signal, which the discriminator 1004 considers to be a true signal. Occurrences of wrong and correct decisions regarding fake and true signals quantify the fooling performance. This competitive approach enables the generator 1002 to be trained to mimic the operation of the eRX 914 based on the internal feedback signal from the iRX 904. After deployment, the generator neural network 1002 may be used as the ML-hi-fi model 905 to improve quality of the internal feedback signals without access to eRX 914.

Figure 11:
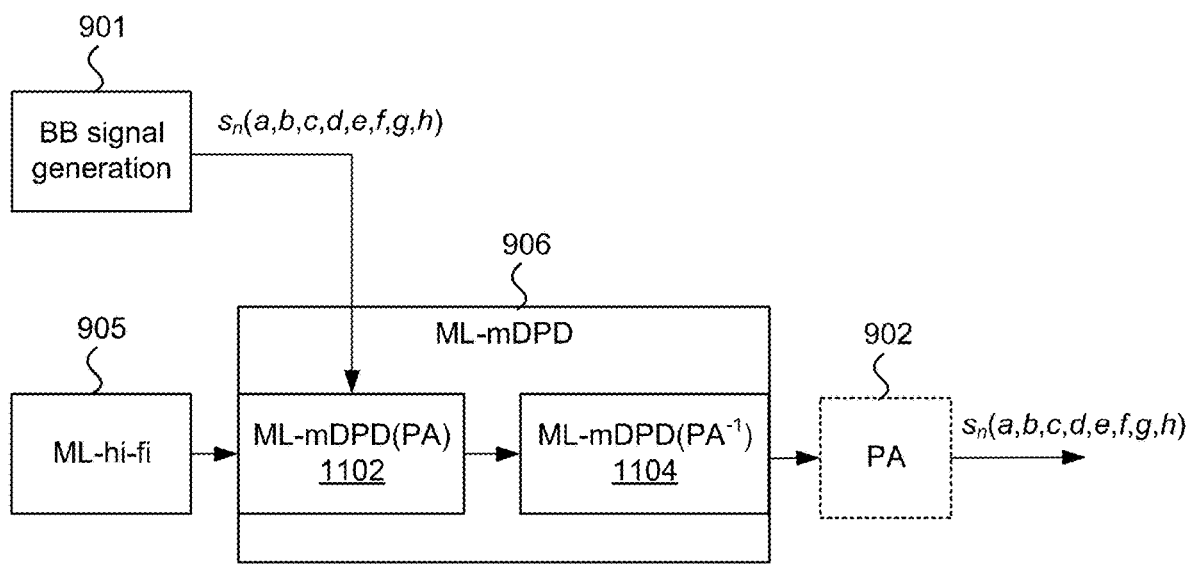
FIG. 11 illustrates an example of training a machine learning based digital pre-distortion model, according to an example embodiment.

FIG. 11 illustrates an example of training a machine learning based digital pre-distortion system, according to an example embodiment. The ML-mDPD model 906 may comprise a cascade of two ML models ML-mDPD(PA) 1102 and ML-mDPD(PA$^{-1}$), which may be trained to model a composite PA response and an inverse of the composite PA response, respectively. The models may be implemented for example as feed-forward neural networks 500 or convolutional neural networks 700 of K layers with $N_k$ neurons per layer. The activation functions at the layers may be linear or non-linear, e.g. ReLu, softmax, or the like. The ML-mDPD model 906 may be trained with samples collected at the output of the PA 902 and with a goal of minimizing the difference, for example the mean squared error, between the output of the ML-mDPD 906 and undistorted samples of the signal $s_n(a,b,c,d,e,f,g,h)$. A subset or a portion of the ML-mDPD model 906 may be used as a digital pre-distortion model for linearizing the PA 902. The subset may comprise a neural network modeling the inverse PA response, for example ML-mDPD(PA$^{-1}$), or parameters thereof. Hence, the digital pre-distortion parameters determined by ML-mDPD model 906 may comprise parameters characterizing the inverse PA response portion of ML-mDPD model 906, ML-mDPD(PA$^{-1}$). Ideally, the output from the PA 902 comprises the same signal $s_n(a,b,c,d,e,f,g,h)$. However, in practice the output signal may comprise an approximation of the input signal $s_n(a,b,c,d,e,f,g,h)$.

Figure 12:
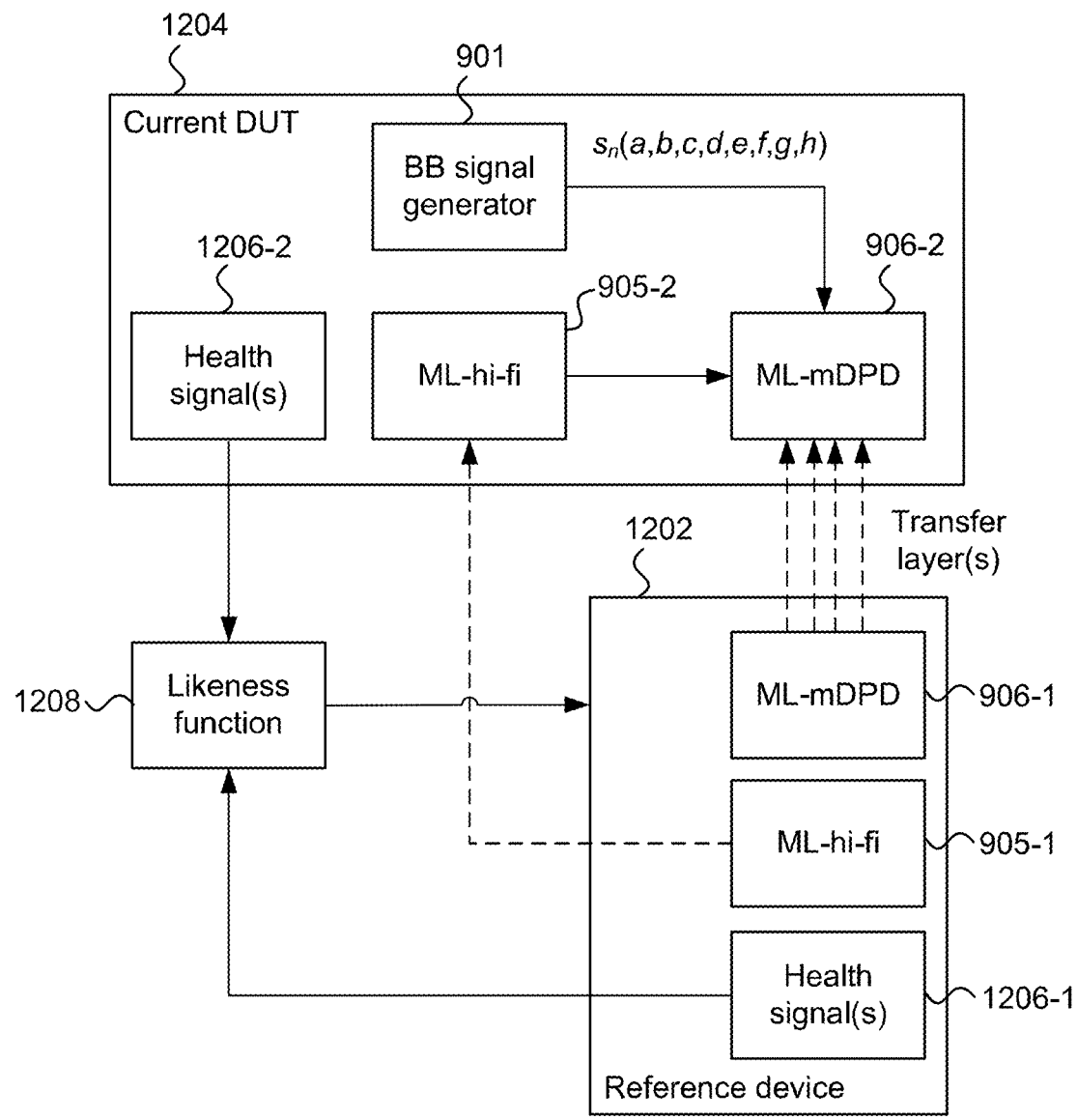
FIG. 12 illustrates an example of transfer learning for an instance of a machine learning based digital pre-distortion system, according to an example embodiment.

FIG. 12 illustrates an example of transfer learning for an instance of a machine learning model based digital pre-distortion system, according to an example embodiment. At Stage 2, for example in UE production phase, ML-based digital pre-distortion systems of multiple devices may be trained such that the baseline ML models trained for the reference device are adapted to device-specific characteristics.

The reference device 1202 may comprise a first baseline ML model, baseline ML-hi-fi model 905-1. The first ML model of the current DUT 1204, ML-hi-fi model 905-2 may be initialized based on the baseline ML-hi-fi model 905-1 of the reference device 1202. For example, before fine-tuning, the ML-hi-fi model 905-2 of the current DUT may comprise a copy of the ML-hi-fi model 905-1 of the reference device 1202.

The reference device 1202 may further comprise a second baseline ML model, baseline ML-mDPD model 906-1. The second ML model of the current DUT 1204, ML-mDPD model 906-2 may be initialized based on the baseline ML-mDPD model 906-1 of the reference device 1206, for example as a copy of the ML-mDPD model 906-1.

However, according to an example embodiment, similarity between the current DUT 1204 and the reference device 1202 may be taken into account when initializing the ML-mDPD model 906-2. For example, the ML-mDPD model 906-2 may be initialized with a subset of the baseline ML-mDPD model 906-1. The subset may comprise a subset of layers of the baseline ML-mDPD model 906-1. The subset may be determined based on a likeness metric between the current DUT 1204 and the reference device 1202. The likeness metric may be computed for example using health signals from the two devices, batch numbers of their power amplifiers, or the like. A health signal may comprise an indication of performance of any transmitter block. The likeness metric may be computed by likeness function 1208, which may be located external to the current DUT 1204 and the reference device 1202. In this case, the Stage 2 training system may determine the subset of baseline ML-mDPD 906-1 for initializing ML-mDPD 906-2. Alternatively, the likeness function 1208 may be included in the current DUT 1204. In this case the, DUT 1204 may determine the subset. The setup of FIG. 12 enables to adapt the ML-hi-fi 905-2 and ML-mDPD 906-2 of the current DUT 1204 to be adapted to device specific characteristics. Furthermore, the likeness function based initialization of the ML-mDPD 906-2 speeds-up the adaptation process while providing sufficient freedom for fine-tuning the ML-mDPD 906-2.

Figure 13:
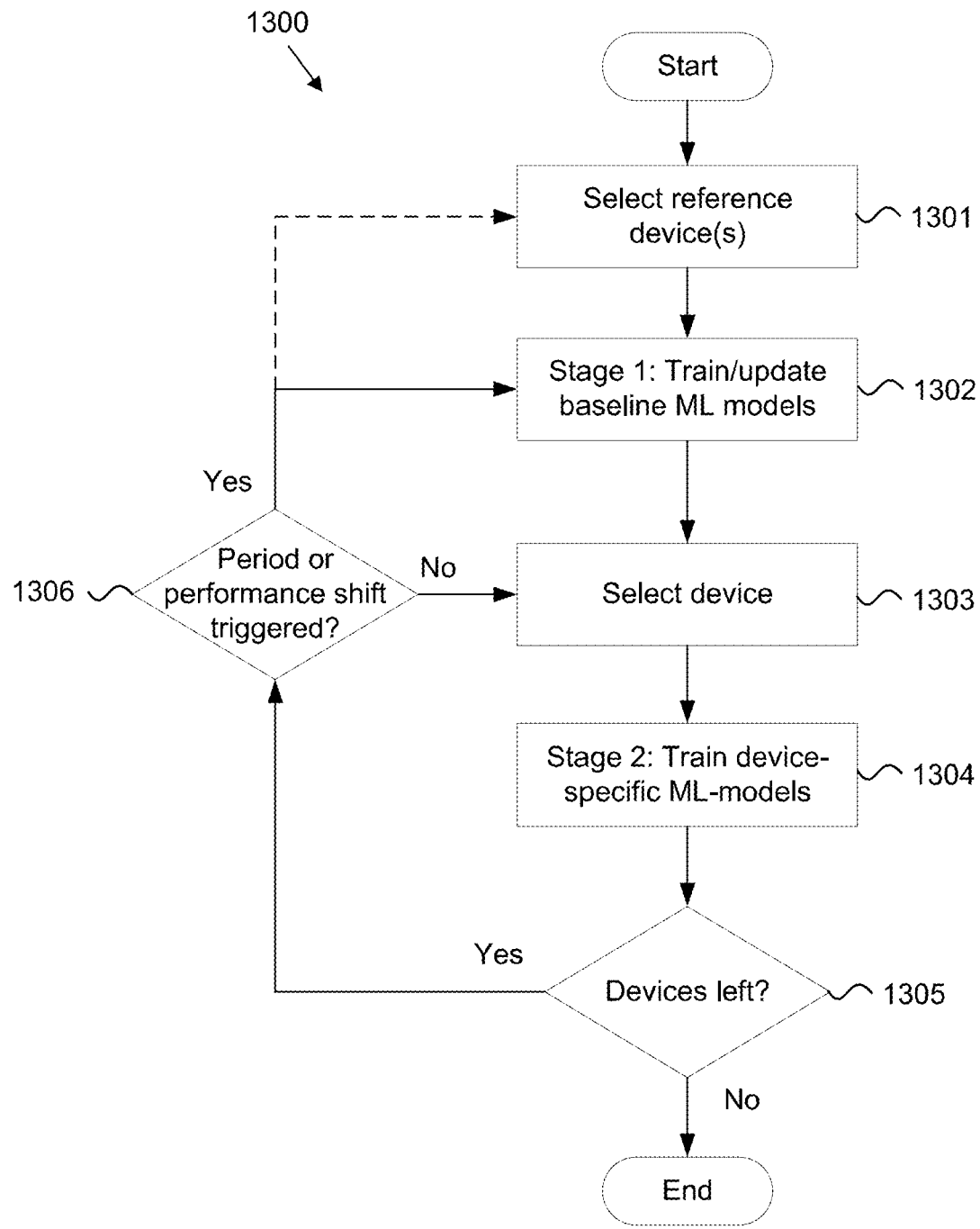
FIG. 13 illustrates an example of a flow chart for general and device-specific training of machine learning based digital pre-distortion systems, according to an example embodiment.

FIG. 13 illustrates an example of a flow chart for general and device-specific training of a machine learning based digital pre-distortion system, according to an example embodiment. Operations of the method 1300 may be performed in Stages 1 and/or 2 and applied for example in a system similar to FIG. 12.

At 1301, the method may comprise selecting one or more reference devices.

At 1302, the method may comprise training the baseline ML models. Operation 1302 may comprise transmitting a set of test signals by the reference device 1202. As discussed above, the reference device may comprise an internal feedback receiver configured to receive the set of test signals to obtain internal feedback signals. The method may further comprise training a first baseline ML model, ML-hi-fi 905-1, to emulate an external feedback receiver and to generate emulated feedback signals based on the internal feedback signals. Training of the first baseline model, ML-hi-fi 905-1, may be based on the internal feedback signals and external feedback signals received from the external feedback receiver. The external feedback signals may correspond to the set of test signals received by the external feedback receiver, for example over the radio interface between antennas 903 and 913.

At 1303, the method may comprise selecting a device as the current DUT 1202.

At 1304, the method may comprise training the device-specific ML models. For example, the ML-hi-fi model 905-2 and the ML-mDPD model 906-2 of the current DUT 1204 may be trained, as described above, to adapt the baseline ML models to the device-specific characteristics of the current DUT 1204. For example, operation 1304 may comprise initializing the instance of the ML-hi-fi model 905-2 based on the baseline ML-hi-fi model 905-1. Operation 1304 may further comprise initializing the instance of the ML-mDPD model 906-2 based on a subset of the ML-mDPD 906-1. Operation 1304 may further comprise determining the subset of the ML-mDPD model 906-1 based on a likeness metric between the device and the reference device. The likeness metric may be determined based on at least one of: batch numbers of the power amplifier of the reference device 1202 and the power amplifier of the current DUT 1204, and transmission performance metrics of the reference device 1202 and the current DUT 1204. A batch number may comprise a serial number characterizing a batch of components obtained during the same manufacturing cycle, from same prime materials, or the like. Hence, the batch number may be used as a similarity measure between the two power amplifiers. A transmission performance metric may comprise an indication of one or more transmission blocks or components. The transmission performance metric may be determined based on the health signals 1206-1 and 1206-2. An example of a health signal is a flag that is triggered when the modem records high levels of adjacent channel leakage.

The likeness metric may be determined based on computing a distance between the current DUT 1204 and the reference device 1202. The likeness metric may be formulated for example as taking three discrete values, e.g. −1=products are dissimilar, 0=inconclusive, 1=products are similar. These three values may be computed by comparing characteristics of the current DUT with the reference device. For example: likeness=1 if {(DUT batch==reference device batch) & (DUT ACLR—reference device ACLR<threshold) }. Depending on the likeness metric, all layers, a subset of layers, or no layers may be transferred when initializing the ML-mDPD model 906-2 of the current DUT. For example, no layers may be transferred if the likeness metric is equal to −1, If likeness metric=0, the input and output layers may be transferred. If likeness=1, all layers may be transferred.

Operation 1304 may further comprise training the instance of the ML-hi-fi model 905-2 to emulate the external feedback receiver and to generate emulated feedback signals based on device-specific internal feedback signals received from an internal feedback receiver of the current DUT 1204. Training of the instance of the ML-hi-fi model 905-2 may be based on the device-specific internal feedback signals and the external feedback signals received from the external feedback receiver. For example, using the GAN approach of FIG. 10 the ML-hi-fi model 905-2 may be trained to mimic the external feedback receiver. This enables more accurate emulation of the external feedback receiver, once the current DUT 1204 has bee deployed in the field and the external feedback signal is no longer available. For example, device-specific characteristics of the power amplifier of the current DUT 1204 may be taken into account when the ML-hi-fi model 905-2 is used to improve the quality of the feedback signal from an internal feedback receiver.

Operation 1304 may further comprise training the instance of the ML-mDPD 906-2 to determine at least one digital pre-distortion parameter for the power amplifier of the current DUT 1204 based on the emulated feedback signals. Training the ML-mDPD 906-2 may be similar to training the baseline ML-mDPD 906-1.

However, according to an example embodiment a reduced test coverage may be used for example by using a subset of test signals when training the ML-hi-fi 905-2 and ML-mDPD 906-2. The subset of test signals may corresponds to a subset of parameters, and/or a subset of parameter values. For example, to speed up the adaptation process, test signals $s_n(a,b,c,d,e,f,g,h)$ may be generated for a subset of parameters a-h, for limited range(s) of the parameters, and/or for particular value(s) of the parameters. Training of the instance of the ML-mDPD 906-2 may be based on the emulated feedback signals and the subset of test signals. The set of parameters may comprise at least one of: transmit power, signal bandwidth, beam configuration, modulation and/or error correction coding scheme, carrier frequency, temperature, battery level, or antenna load.

At 1305, the method may comprise determining whether there are any devices left. If all devices for a current set of devices have been trained, the method may be ended. If there are further devices to be trained, the procedure may move to operation 1306 to determine whether the baseline ML models should be updated or further reference devices should be selected. Alternatively, the procedure may move directly to operation 1303 to select a next device as the current DUT 1204.

At 1306, the method may comprise determining whether a period and/or performance shift have been triggered. If not, the procedure may move to operation 1303 to select a next device as the current DUT 1204, for which adaptation of the ML models may be performed at 1304. Hence, the method may comprise training a plurality of devices with a subset of test signals. Training of each device may comprise the operations described above.

In response to detecting a period or performance shift to be triggered at 1306, the procedure may move to 1302 to update the baseline ML models. For example, at regular or otherwise predetermined intervals, or whenever a performance shift is observed, a device may be picked out for more extensive tests. Such full lab characterization may be revisited from time to time to update the baseline ML models during device production (Stage 2). This enables to absorb any shift due to component batch changes or other effects. The method may therefore comprise re-training the baseline ML-hi-fi model 905-1 and/or the baseline ML-mDPD model 906-1 with the set of test signals after training a predetermined number of devices, and/or in response to detecting a shift in power amplifier linearization performance among the plurality of devices. For example, if performance of the generated DPD coefficients of a device differs from performance of previously trained devices or an average performance of previously trained devices by a certain threshold, the system may initiate re-training of the baseline ML model(s) to keep them up to date and to reduce the number of training iterations when fine-tuning ML models of further devices.

Alternatively, from 1306 the procedure may move back to 1301 to select different reference device(s), for example randomly. The baseline ML model(s) may be then updated at 1302 based on the new reference device(s) and further devices may be initialized based on the updated baseline ML model(s) at 1304.

The method 1300 enables efficient training of ML based digital pre-distorters and adaptation of the ML models for device-specific characteristics. Furthermore, the method enables dynamic adaptation of the baseline ML models to maintain good training efficiency even with variable characteristics within devices in production.

Figure 14:
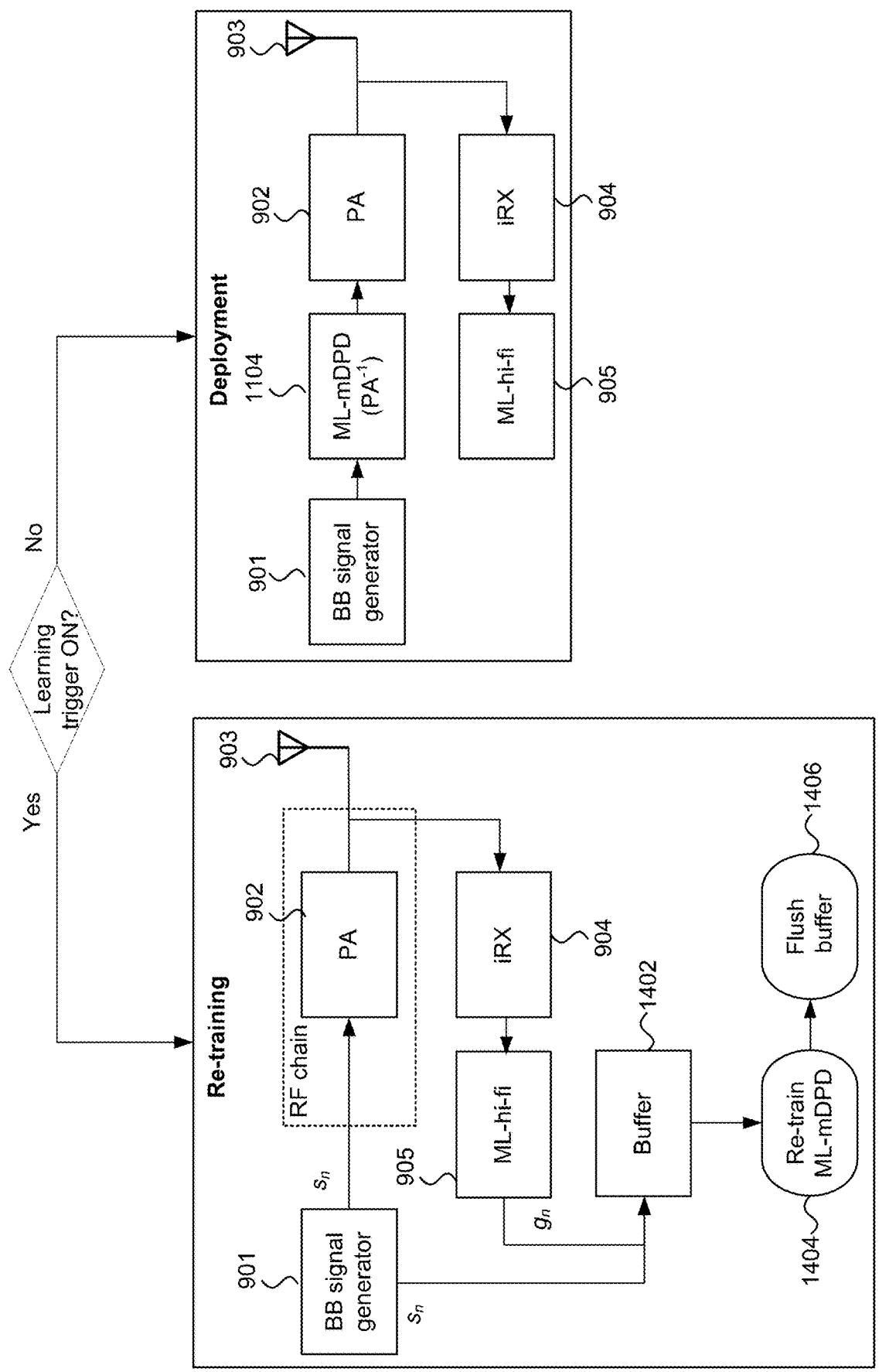
FIG. 14 illustrates an example of deployment and re-training of a machine learning based digital pre-distortion system, according to an example embodiment.

FIG. 14 illustrates an example of deployment and re-training of a machine learning based digital pre-distortion system, according to an example embodiment. The illustrated procedure may be applied in Stage 3, for example when a device is operating in the field and does not have access to the external feedback received. The device may be for example transmitting signals compliant with 3GPP specifications, instead of the test signals $s_n(a,b,c,d,e,f,g,h)$. The device may comprise a baseband signal generator 901, a power amplifier 902, antenna 903, an internal feedback receiver 904, and an ML-hi-fi model 905. The device may further comprise a digital pre-distortion ML model, for example ML-mDPD($PA^{-1}$) 1104, configured to linearize the output of the power amplifier 902. The device may further comprise an ML-mDPD model (not shown).

Since the device may not have access to an external feedback receiver, the ML-hi-fi model 905 may not be trained at this phase. However, if triggered, ML-hi-fi model 905 may receive the internal feedback signal form iRX 904 and generate the emulated feedback signal $g_n$ to mimic the external feedback receiver in order to re-train the ML-mDPD model. When a learning trigger is OFF, the device may operate according to the "Deployment" branch of the procedure. In response to detecting learning trigger to be or transition to the ON state, the device may operate according to the "Re-training" branch of the procedure. The state of the learning trigger may be obtained from the network, which may determine it for example based on SINR (signal-to-interference-plus-noise ratio) reports from nearby devices. Alternatively, the state of the learning trigger may be determined locally, e.g. periodically, as will be further discussed below. When ML-mDPD training is triggered, for example a flag is raised, the signal $s_n$ may be stored in buffer 1402. The ML-hi-fi model 905 may be also activated. The output of the ML-hi-fi model 905, the emulated feedback signal $g_n$, may be also buffered. In response to determining that the signals $s_n$ and $g_n$ have been sufficiently buffered, the ML-mDPD may be switched from deployment to learning.

At 1404, the ML-mDPD may be re-trained based on the emulated feedback signal $g_n$ and the signal $s_n$, which is subject to transmission. Re-training the ML-mDPD may be in response to detecting expiry of a re-training period. For example, the device may be configured with or receive signaling information about a re-training period, for example daily, weekly, or the like. Once the re-training period has expired, the device may initiate re-training. Once the learning is complete, the buffer may be flushed, at 1406. The re-training period may be preconfigured, or it may be determined based on a type of the device. A type of a device may comprise a robot in a factory, a handheld device, a sensor, or the like. Different re-training periods may be preconfigured or signaled by a network node to the devices. For example, re-training may be configured to take place every few days for the former to every few months for the latter example devices.

Alternatively, or additionally, re-training the ML-mDPD may be in response to detecting a change in performance of the power amplifier. For example, re-training may be initiated if a transmission performance metric, such as for example adjacent channel leakage ratio, no longer satisfies a configured or signaled requirement. This enables the device to adapt for example to changing antenna loads and degradation of hardware components due to aging.

Alternatively, or additionally, re-training of the ML-mDPD may be in response to detecting an update of at least one transmission parameter of the signal. For example, a change in transmission parameters such as for example bandwidth or a modulation and/or coding scheme may affect operation of the power amplifier 902. Therefore, re-training the ML-mDPD in response to detecting such change enables to maintain good DPD performance with dynamically variable transmission parameters.

Alternatively, or additionally, re-training the ML-mDPD may be in response to receiving an instruction to perform re-training from a network node, such as for example a 5G base station, gNB. This enables a network node to control performance of devices, such as for example UEs, operating within a coverage area of the network node.

Figure 15:
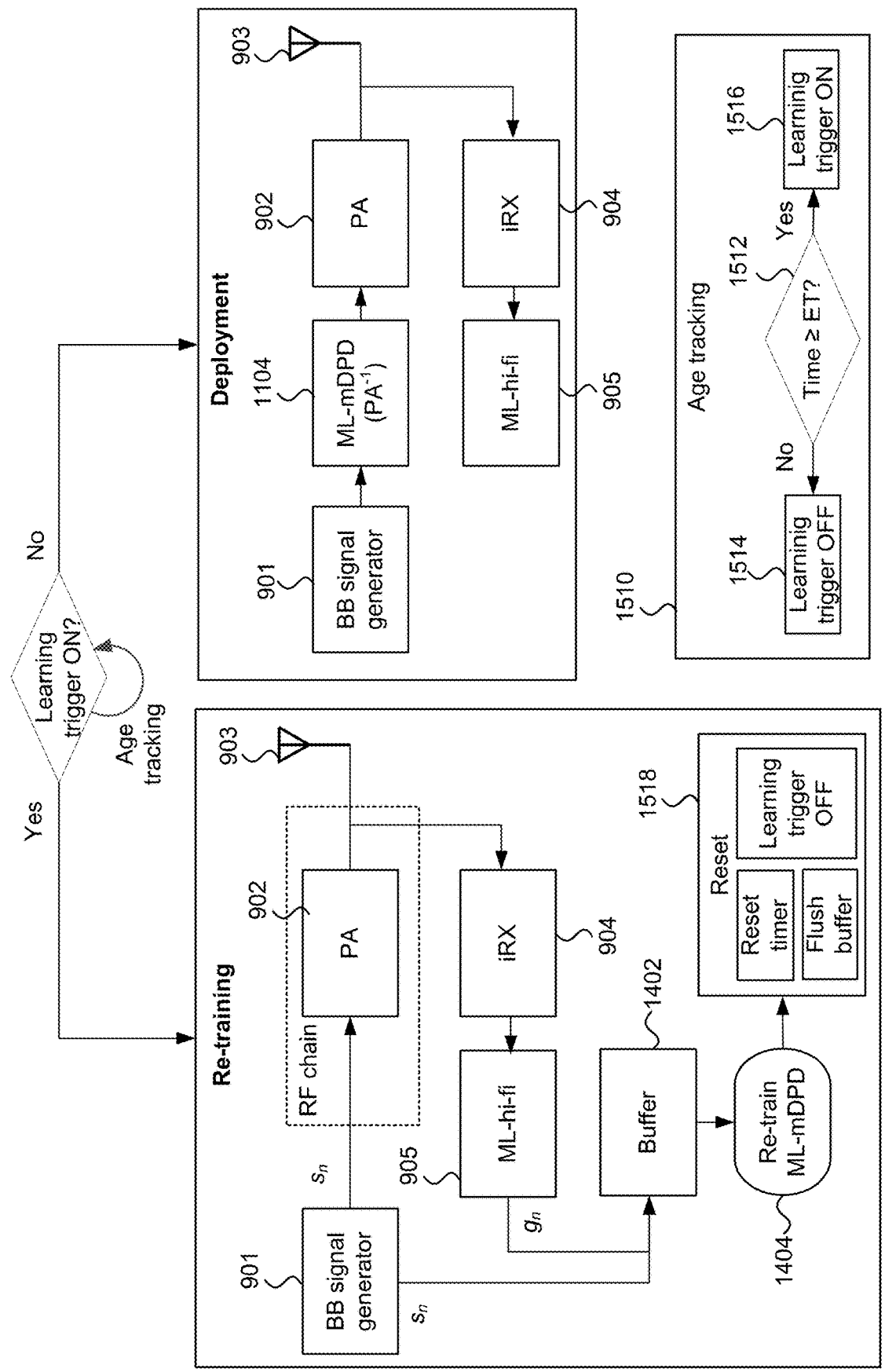
FIG. 15 illustrates another example of deployment and re-training of a machine learning based digital pre-distortion system, according to an example embodiment.

FIG. 15 illustrates another example of application and re-training of a machine learning based digital pre-distortion system, according to an example embodiment. The device may comprise functions and/or blocks similar to FIG. 14. However, the device may further comprise an age tracking function 1510 configured to control the learning trigger. The age tracking function 1510 may be executed in the background continuously or periodically. At 1512, the age tracking function may determine whether a period corresponding to an expiry time (ET) has lapsed. If not, the learning trigger may be set or maintained at an OFF state, at 1514. If yes, the learning trigger may be set to an ON state, at 1516. The device may further comprise a reset function 1518 associated with re-training of the ML-mDPD model. In response to completing re-training of the ML-mDPD model, the device may flush the buffer 1402, similar to 1406. Furthermore, the timer may be reset and the learning trigger may be set back to the OFF state. The example embodiments of FIG. 14 and FIG. 15 enable the ML based digital pre-distortion system to be re-trained to mitigate effects of aging and different types of environmental influence.

Example embodiments of the present disclosure enable improving accuracy of digital pre-distortion applied for linearizing a power amplifier. The example embodiments may be beneficial for example in mmWave systems, but it is appreciated that the example embodiments may be applied also for other frequency ranges.

Figure 16:
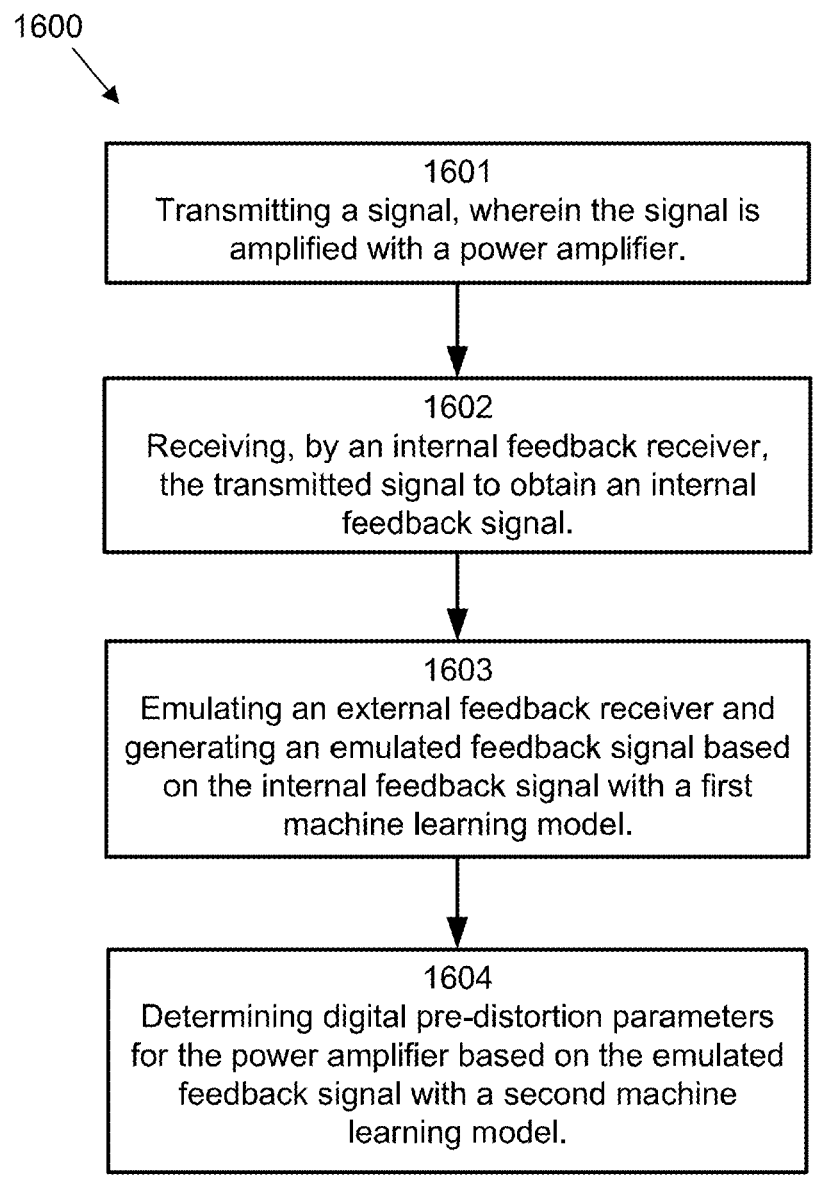
FIG. 16 illustrates an example of a method for applying a machine learning based digital pre-distortion system, according to an example embodiment.

FIG. 16 illustrates an example of a method 1600 for applying a machine learning based digital pre-distortion system, according to an example embodiment;

At 1601, the method may comprise transmitting a signal, wherein the signal is amplified with a power amplifier.

At 1602, the method may comprise receiving, by an internal feedback receiver, the transmitted signal to obtain an internal feedback signal.

At 1603, the method may comprise emulating an external feedback receiver and generating an emulated feedback signal based on the internal feedback signal with a first machine learning model.

At 1604, the method may comprise determining digital pre-distortion parameters for the power amplifier based on the emulated feedback signal with a second machine learning model.

According to an example embodiment, a bandwidth of the internal feedback receiver may be lower than a bandwidth of the external feedback receiver, and/or a dynamic range of the internal feedback receiver may be lower than a dynamic range of the external feedback receiver.

According to an example embodiment, the method may further comprise linearizing the power amplifier based on the digital pre-distortion parameters, wherein the digital pre-distortion parameters comprise a subset of the second machine learning model.

According to an example embodiment, the method may further comprise re-training the second machine learning model based on the emulated feedback signal and the signal in response to one of: detecting expiry of a re-training period; detecting a change in performance of the power amplifier; detecting an update of at least one transmission parameter of the signal; or receiving an instruction to perform re-training from a network node.

According to an example embodiment, the method may further comprise determining the re-training period based on a type of the apparatus.

According to an example embodiment, the method may further comprise receiving an external feedback signal from the external feedback receiver; training the first machine learning model based on the internal feedback signal and the external feedback signal; and training the second machine learning model based on the emulated feedback signal and the signal.

According to an example embodiment, the method may further comprise initializing the first machine learning model with a first baseline machine learning model trained with at least one reference device, and initializing the second machine learning model with a subset of a second baseline machine learning model trained with the at least one reference device.

According to an example embodiment, the subset of the second baseline machine learning model may comprise a subset of layers of the second baseline machine learning model.

According to an example embodiment, the first machine learning model may comprise a generator network of a generative adversarial network (GAN).

Figure 17:
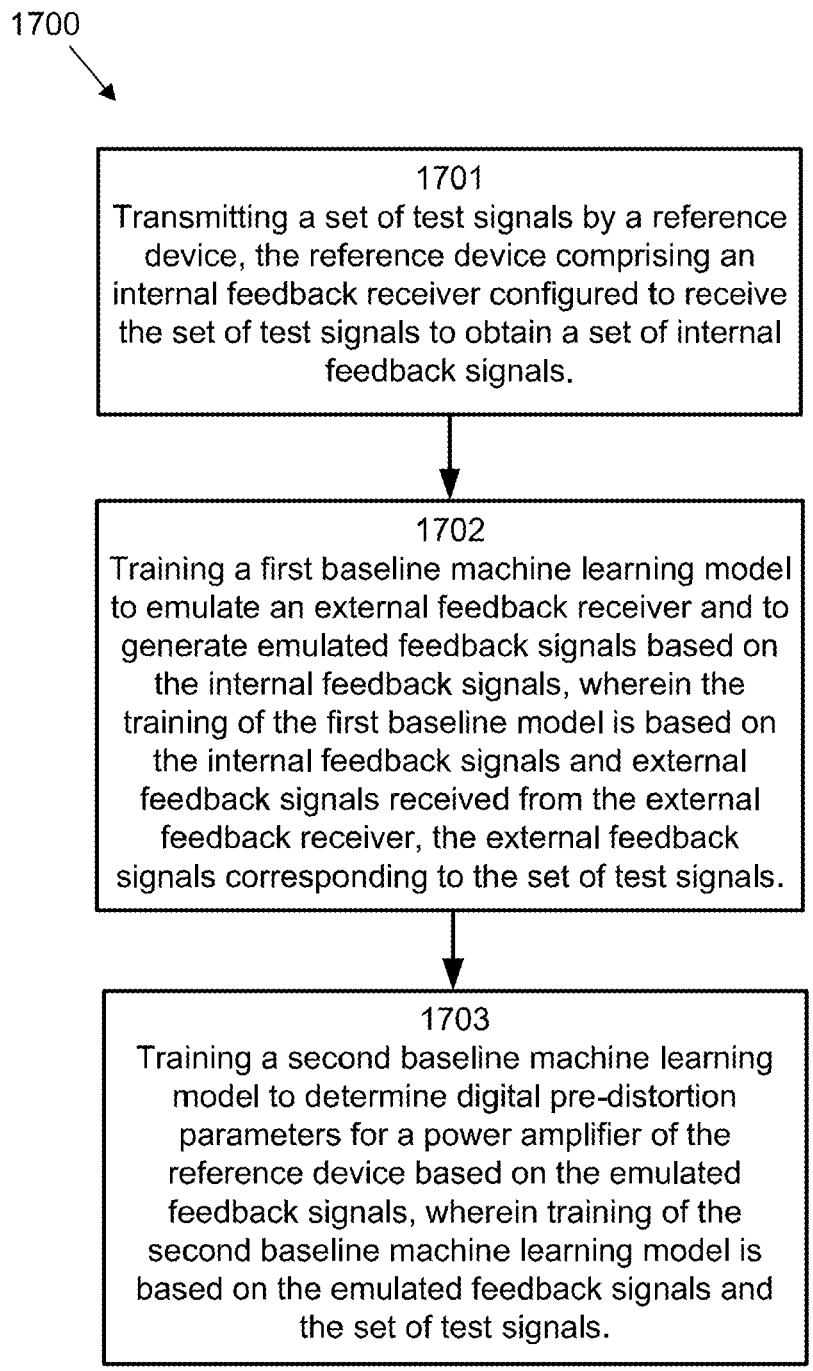
FIG. 17 illustrates an example of a method for training a machine learning based digital pre-distortion system, according to an example embodiment.

FIG. 17 illustrates an example of a method for training a machine learning based digital pre-distortion system, according to an example embodiment;

At 1701, the method may comprise transmitting a set of test signals by a reference device, the reference device comprising an internal feedback receiver configured to receive the set of test signals to obtain a set of internal feedback signals.

At 1702, the method may comprise training a first baseline machine learning model to emulate an external feedback receiver and to generate emulated feedback signals based on the internal feedback signals, wherein the training of the first baseline model is based on the internal feedback signals and external feedback signals received from the external feedback receiver, the external feedback signals corresponding to the set of test signals.

At 1703, the method may comprise training a second baseline machine learning model to determine digital pre-distortion parameters for a power amplifier of the reference device based on the emulated feedback signals, wherein training of the second baseline machine learning model is based on the emulated feedback signals and the set of test signals.

According to an example embodiment, the method may further comprise training a plurality of devices with a subset of test signals, wherein training of each device of the plurality of devices comprises: initializing an instance of the first machine learning model based on the first baseline machine learning model; initializing an instance of second machine learning model based on a subset of the second baseline machine learning model; training the instance of the first machine learning model to emulate the external feedback receiver and to generate emulated feedback signals based on device-specific internal feedback signals received from an internal feedback receiver of the device, wherein the training of the instance of the first machine learning model is based on the device-specific internal feedback signals and the external feedback signals received from the external feedback receiver; and training the instance of the second machine learning model to determine digital pre-distortion parameters for a power amplifier of the device based on the emulated feedback signals, wherein training of the instance of the second machine learning model of is based on the emulated feedback signals and the subset of test signals.

According to an example embodiment, the method may further comprise re-training the first baseline machine learning model and the second baseline machine learning model with the set of test signals after training a predetermined number of devices.

According to an example embodiment, the method may further comprise re-training the first baseline machine learning model and the second baseline machine learning model with the set of test signals, in response to detecting a shift in power amplifier linearization performance among the plurality of devices.

According to an example embodiment, the method may further comprise determining the subset of the second baseline model based on a likeness metric between the device and the reference device.

According to an example embodiment, the method may further comprise determining the likeness metric based on at least one of: batch numbers of the power amplifier of the reference device and the power amplifier of the device; and transmission performance metrics of the reference device and the device.

According to an example embodiment, the subset of the second baseline machine learning model may comprise a subset of layers of the second baseline machine learning model.

According to an example embodiment, the set of test signals may be characterized by a set of parameters comprising at least one of: transmit power, signal bandwidth, beam configuration, modulation and/or error correction coding scheme, carrier frequency, temperature, battery level, or antenna load.

According to an example embodiment, the subset of test signals may correspond to a subset of the parameters, and/or the subset of test signals may correspond to a subset of parameter values.

Further features of the methods directly result from the functionalities and parameters of the apparatuses and/or the DPD training systems or architectures, as described in the appended claims and throughout the specification, and are therefore not repeated here. It is noted that one or more steps of the method may be performed in different order.

An apparatus, may be configured to perform or cause performance of any aspect of the method(s) described herein. Further, a computer program may comprise instructions for causing, when executed, an apparatus to perform any aspect of the method(s) described herein. Further, a computer program may be configured to, when executed, to cause an apparatus at least to perform any aspect of the method(s) described herein. Further, a computer program product or a computer readable medium may comprise program instructions for causing an apparatus to perform any aspect of the method(s) described herein. Further, an apparatus may comprise means for performing any aspect of the method(s) described herein. According to an example embodiment, the means comprises at least one processor, and at least one memory including program code, the at least one memory and the program code configured to, with the at least one processor, cause the apparatus at least to perform any aspect of the method(s).

Any range or device value given herein may be extended or altered without losing the effect sought. Also, any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items. Furthermore, references to 'at least one' item or 'one or more' items may refer to one or a plurality of those items.

The steps or operations of the methods described herein may be carried out in any suitable order, or simultaneously where appropriate. Additionally, individual blocks may be deleted from any of the methods without departing from the scope of the subject matter described herein.

Aspects of any of the example embodiments described above may be combined with aspects of any of the other example embodiments described to form further example embodiments without losing the effect sought.

The term 'comprising' is used herein to mean including the method, blocks, or elements identified, but that such blocks or elements do not comprise an exclusive list and a method or apparatus may contain additional blocks or elements.

As used in this application, the term 'circuitry' may refer to one or more or all of the following: (a) hardware-only circuit implementations (such as implementations in only analog and/or digital circuitry) and (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and or processor(s), such as a microprocessor(s) or a portion of a microprocessor(s), that requires software (e.g., firmware) for operation, but the software may not be present when it is not needed for operation. This definition of circuitry applies to all uses of this term in this application, including in any claims.

As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from scope of this specification.

The invention claimed is:

1. A method performed in an apparatus, comprising:
transmitting a signal, wherein the signal is amplified by a power amplifier for transmission;
receiving, by an internal feedback receiver that is internal to the apparatus, the transmitted signal to produce an internal feedback signal;
generating an emulated feedback signal based on the internal feedback signal by a first machine learning model that has been previously trained to emulate a second feedback receiver that received the transmitted signal during training;
determining digital pre-distortion parameters for the power amplifier based at least on the emulated feedback signal by a second machine learning model.

2. The method according to claim 1 wherein a bandwidth of the internal feedback receiver is lower than a bandwidth of the second feedback receiver.

3. The method according to claim 1 wherein a dynamic range of the internal feedback receiver is lower than a dynamic range of the second feedback receiver.

4. The method according to claim 1 further comprising:
linearizing output of the power amplifier based on the digital pre-distortion parameters.

5. The method according to claim 1, further comprising:
re-training the second machine learning model based on the emulated feedback signal and the signal in response to at least one of:
detecting expiry of a re-training period;
detecting a change in performance of the power amplifier;
detecting an update of at least one transmission parameter of the signal; or
receiving an instruction to perform re-training from a network node.

6. The method according to claim 1, further comprising:
receiving an external feedback signal from the second feedback receiver;
training the first machine learning model based on the internal feedback signal and the external feedback signal; and
training the second machine learning model based on the emulated feedback signal and the signal.

7. The apparatus according to claim 1, wherein the first machine learning model comprises a generator network of a generative adversarial network (GAN), the generator network previously trained using a discriminator network of the GAN.

8. A system, comprising:
a reference device configured to transmit a set of test signals, the reference device comprising an internal feedback receiver internal to an apparatus and configured to receive the set of test signals to produce internal feedback signals;
a second feedback receiver configured to receive transmitted signals, corresponding to the set of test signals that have been transmitted after amplification by a power amplifier of the reference device, to produce external feedback signals;
a first machine learning model configured to emulate the second feedback receiver and to generate emulated feedback signals based on the internal feedback signals, wherein training of the first baseline model is based on the internal feedback signals and the external feedback signals received from the second feedback receiver; and
a second machine learning model configured to determine digital pre-distortion parameters for the power amplifier of the reference device based on the emulated feedback signals, wherein training of the second baseline machine learning model is based on the emulated feedback signals and the set of test signals.

9. A system according to claim 8, wherein the test signal is characterized by one or more signals related to environment parameters.

10. A system according to claim 9, wherein said environment parameters comprise at least one of transmit power, signal bandwidth, beam configuration, modulation, error correction coding scheme, carrier frequency, temperature, battery level, or antenna load.

11. An apparatus comprising:
at least one processor; and
at least one memory including computer program code;
the at least one memory and the computer program code configured to, with the at least one processor, cause the apparatus at least to:
transmit, by a transmitter, a signal, wherein the transmitter comprises a power amplifier that amplifies the signal for transmission;
receive, by an internal feedback receiver that is internal to the apparatus, the transmitted signal to produce an internal feedback signal;
emulate, by a first machine learning model, an external feedback receiver and to generate, by the first machine learning model that has been previously trained to emulate a second feedback receiver that received the transmitted signal during training, an emulated feedback signal based on the internal feedback signal; and
determine, by a second machine learning model, digital pre-distortion parameters for the power amplifier based at least on the emulated feedback signal.

12. The apparatus according to claim 11 wherein a bandwidth of the internal feedback receiver is lower than a bandwidth of the second feedback receiver.

13. The apparatus according to claim 11 wherein a dynamic range of the internal feedback receiver is lower than a dynamic range of the second feedback receiver.

14. The apparatus according to claim 11 wherein the at least one memory and the computer program code are further configured, with the at least one processor, to cause the apparatus at least to:
linearize output of the power amplifier based on the digital pre-distortion parameters.

15. The apparatus according to claim 14 wherein the digital pre-distortion parameters comprise a subset of the second machine learning model.

16. The apparatus according to claim 11, wherein the at least one memory and the computer program code are further configured, with the at least one processor, to cause the apparatus at least to:
re-train the second machine learning model based on the emulated feedback signal and the signal in response to at least one of:
detecting expiry of a re-training period;
detecting a change in performance of the power amplifier;
detecting an update of at least one transmission parameter of the signal; or
receiving an instruction to perform re-training from a network node.

17. The apparatus according to claim 11, wherein the at least one memory and the computer program code are further configured, with the at least one processor, to cause the apparatus at least to:
receive an external feedback signal from the second feedback receiver;
train the first machine learning model based on the internal feedback signal and the external feedback signal; and
train the second machine learning model based on the emulated feedback signal and the signal.

18. The apparatus according to claim 11, wherein the first machine learning model comprises a generator network of a generative adversarial network (GAN), the generator network previously trained using a discriminator network of the GAN.

19. The apparatus according to claim 11, wherein the apparatus is comprised in a user equipment of a cellular communication system.

20. The apparatus according to claim 11, wherein the second receiver during training received the transmitted signal over a radio interface.

* * * * *